(12) United States Patent
Komiyama et al.

(10) Patent No.: US 7,229,843 B2
(45) Date of Patent: Jun. 12, 2007

(54) DEVICE AND METHOD FOR MONITORING PROCESS EXHAUST GAS, SEMICONDUCTOR MANUFACTURING DEVICE, AND SYSTEM AND METHOD FOR CONTROLLING SEMICONDUCTOR MANUFACTURING DEVICE

(75) Inventors: Kiyoshi Komiyama, Nirasaki (JP); Takahiro Shimoda, Nirasaki (JP); Hiroshi Nishikawa, Tokyo (JP)

(73) Assignee: Tokyo Electron Limited, Tokyo (JP)

( * ) Notice: Subject to any disclaimer, the term of this patent is extended or adjusted under 35 U.S.C. 154(b) by 320 days.

(21) Appl. No.: 11/062,470

(22) Filed: Feb. 22, 2005

(65) Prior Publication Data
US 2005/0159899 A1 Jul. 21, 2005

Related U.S. Application Data

(60) Continuation of application No. 10/760,581, filed on Jan. 21, 2004, now Pat. No. 6,942,891, which is a division of application No. 10/111,481, filed as application No. PCT/JP00/07457 on Oct. 25, 2000, now Pat. No. 6,716,477.

(30) Foreign Application Priority Data
Oct. 26, 1999 (JP) ............................. 11-303534
Sep. 28, 2000 (JP) ............................. 2000-297203

(51) Int. Cl.
*H01L 21/00* (2006.01)
(52) U.S. Cl. ............................................. 438/8
(58) Field of Classification Search ............ 438/5–7, 438/10–11, 104, 106–114, 118, 141–123, 438/128, 129, 135, 142, 145, 149, 151, 157, 438/176, 478, 201–203, 206–211, 337, 353, 438/378, 401, 410, 184, 193, 195
See application file for complete search history.

(56) References Cited

U.S. PATENT DOCUMENTS

| 4,485,125 A | * | 11/1984 | Izu et al. ..................... 427/74 |
| 5,233,861 A | * | 8/1993 | Gore et al. ................... 73/1.16 |
| 5,284,547 A | | 2/1994 | Watanabe |
| 5,534,073 A | * | 7/1996 | Kinoshita et al. ........... 118/728 |
| 5,777,205 A | | 7/1998 | Nakagawa |
| 5,867,710 A | | 2/1999 | Dorris et al. |
| 5,897,710 A | | 4/1999 | Sato |

(Continued)

FOREIGN PATENT DOCUMENTS

GB 2 265 634 A 10/1993

(Continued)

*Primary Examiner*—Walter Lindsay, Jr.
*Assistant Examiner*—Andre' Stevenson
(74) *Attorney, Agent, or Firm*—Pillsbury Winthrop Shaw Pittman, LLP

(57) ABSTRACT

Process exhaust gas is sampled, and the components of the process exhaust gas are analyzed by a Fourier-transform infrared spectroscope (FT-IR) (26). The analysis result is compared with a reference analysis result obtained from an analysis of process exhaust gas generated in an operation performed under reference process conditions. If the amount of a gas component changes to an amount that is outside a predetermined range set around a reference value obtained from the reference analysis result, a signal indicating a process error is outputted. Instead of the output of the signal indicating a process error, the process conditions can be automatically adjusted.

19 Claims, 23 Drawing Sheets

U.S. PATENT DOCUMENTS

| | | |
|---|---|---|
| 6,303,395 B1 | 10/2001 | Nulman |
| 2005/0215063 A1* | 9/2005 | Bergman .................... 438/710 |

FOREIGN PATENT DOCUMENTS

| | | |
|---|---|---|
| JP | 6215162 A | 7/1987 |
| JP | 5275352 A | 10/1993 |
| JP | 05291188 A | 11/1993 |
| JP | 06342761 A | 12/1994 |
| JP | 09129529 A | 5/1997 |
| JP | 09134912 A | 5/1997 |
| JP | 10212197 A | 8/1998 |

* cited by examiner

FIG. 5

LOT INFORMATION
PROCESS SIGNAL FOR EACH WAFER
MFC FLOW RATE INFORMATION
MFC FLOW RATE CHECK SIGNAL

ANALYSIS RESULT HISTORY

EXHAUST GAS COMPONENT ANALYSIS RESULT

OPERATION SIGNAL

FT-IR — 26

FLOW METER CONTACT SIGNAL

N2 (FLOW METER CONTROL)

VALVE BOX — 24

FT-IR VALVE CONTROLLER — 30

EXHAUST GAS COMPONENT ERROR SIGNAL
MFC FLOW RATE ERROR SIGNAL

OPERATION SIGNAL
FLOW RATE SETTING

N2 (M.F.C CONTROL)
EXHAUST GAS SAMPLE
EXHAUST

PROCESS DEVICE — 60

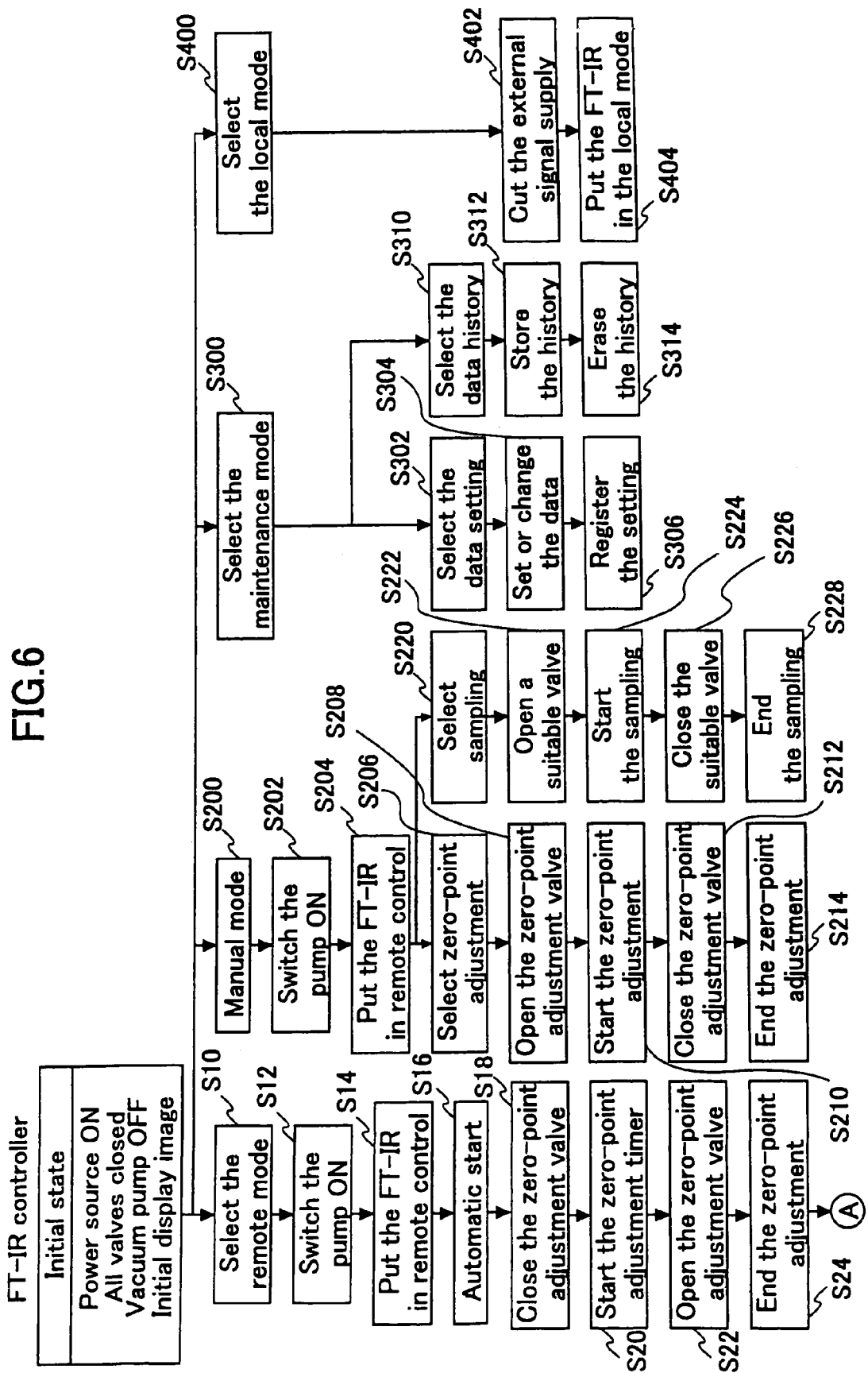

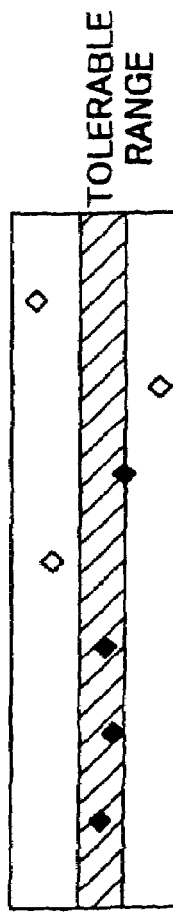
FIG.19A CF4
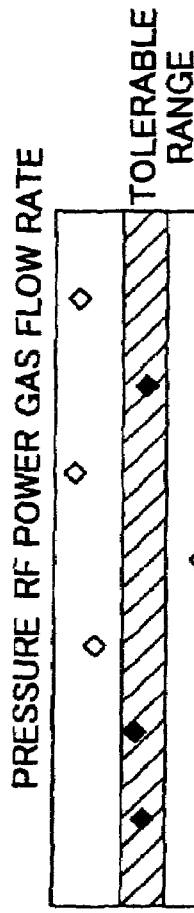
FIG.19B SiF4
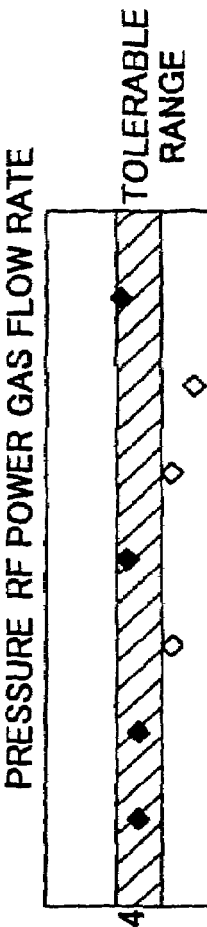
FIG.19C C2F4
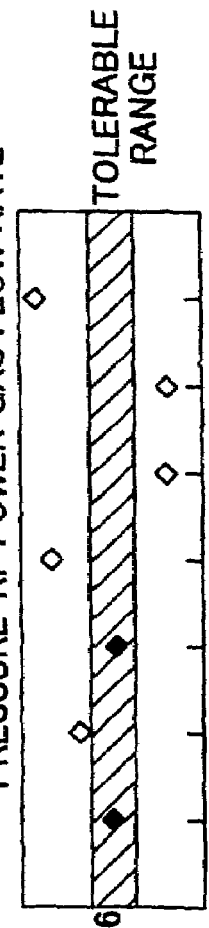
FIG.19D C2F6

FIG.20

| PARAMETER | GAS TYPE | CF4 | SiF4 | C2F4 | C2F6 | RECOGNITION SIGNAL |
|---|---|---|---|---|---|---|
| CHAMBER INNER PRESSURE | Low | ◆ | ◆ | ◆ | ◇ | 0001 |
| | | 0 | 0 | 0 | 1 | |
| | Hi | ◆ | ◇ | ◇ | ◆ | 0110 |
| | | 0 | 1 | 1 | 0 | |
| RF POWER | Low | ◇ | ◇ | ◆ | ◇ | 1101 |
| | | 1 | 1 | 0 | 1 | |
| | Hi | ◆ | ◇ | ◇ | ◇ | 0111 |
| | | 0 | 1 | 1 | 1 | |
| GAS FLOW RATE (C5F8) | Low | ◇ | ◆ | ◇ | ◇ | 1011 |
| | | 1 | 0 | 1 | 1 | |
| | Hi | ◇ | ◇ | ◇ | ◇ | 1111 |
| | | 1 | 1 | 1 | 1 | |

FIG.22

DISPLAY SCREEN

| Error in Process Conditions | Cause of Failure |
|---|---|
| The chamber inner pressure may have decreased. | Shield ring damage |
|  | ·········· |
| <u>Please check the chamber inner pressure for a decrease.</u> | ········· |

DEVICE AND METHOD FOR MONITORING PROCESS EXHAUST GAS, SEMICONDUCTOR MANUFACTURING DEVICE, AND SYSTEM AND METHOD FOR CONTROLLING SEMICONDUCTOR MANUFACTURING DEVICE

This is a divisional application of U.S. patent application Ser. No. 10/760,581, filed Jan. 21, 2004 now U.S. Pat. No. 6,942,891, issue fee now paid, which is a divisional of U.S. patent application Ser. No. 10/111,481, filed on Apr. 25, 2002 now U.S. Pat. No. 6,716,477, now U.S. Pat. No. 6,716,477, which is the U.S. National Stage of International Application No. PCT/JP00/07457, filed Oct. 25, 2002, which relies upon for priority Japanese Application No. 2000-297203, filed Sep. 28, 2000 and Japanese Patent Application No. 11-303534, filed Oct. 26, 1999, the contents of all of which are incorporated herein in their entireties by reference.

TECHNICAL FIELD

The present invention relates to a device and a method for monitoring process exhaust gas, a semiconductor manufacturing device equipped with the monitoring device, and a system and a method for controlling the semiconductor manufacturing device, and, more particularly, to a device and a method for monitoring process exhaust gas by analyzing the gas components of various types exhausted during a semiconductor manufacturing process, a semiconductor manufacturing device equipped with such a monitoring device, and a system and a method for controlling such a semiconductor manufacturing device.

BACKGROUND ART

Generally, various types of process gases are used in the manufacturing process of a semiconductor circuit. In a semiconductor manufacturing device for manufacturing semiconductor devices using process gases, the process conditions are monitored so as to process semiconductor wafers stably and accurately. The process conditions to be monitored include the process gas flow rates, the pressure and temperature in the process chamber, the RF power, the RF reflected wave, the voltage of electrostatic chuck, and the coolant gas pressure.

FIG. 1 is a schematic view of the entire structure of a semiconductor manufacturing device including a conventional monitoring device. The semiconductor manufacturing device shown in FIG. 1 includes a RF plasma processing device 2, a controller 4 for controlling each operation of the semiconductor manufacturing device, a power source unit 6, a process gas supply device 8, and a gas flow meter 10. These devices are arranged in a housing 12, and function in cooperation with one another as one semiconductor manufacturing device.

The RF plasma processing device 2 carries out a predetermined process using plasma on a process object to be processed (e.g., a semiconductor wafer). The process object to be processed is subjected to the plasma processing in a process chamber 2a. Process gas is supplied as a plasma source from the process gas supply device 8 into the process chamber 2a. Other various gases for controlling the process environment in the process chamber 2a are also supplied to the process chamber 2a. The flow rates of the process gas and the other various gases supplied into the process chamber 2a are measured and monitored by the gas flow meter 10.

As a result of the processing of the process object, exhaust gas is generated in the process chamber 2a. Below the process chamber 2a, a turbo molecular pump (TMP) 2b is provided to suck the exhaust gas from the process chamber 2a and then discharge the exhaust gas to an exhauster 14. The exhaust gas is then exhausted from a dry pump 16 via the exhauster 14 to a device such as a cleaning device (not shown).

In the semiconductor manufacturing device having the above structure, various sensors are provided in the RF plasma processing device 2, so as to monitor the process conditions. More specifically, the RF power and its reflected wave supplied to the RF plasma processing device 2 are monitored. The pressure and the temperature in the process chamber 2a of the RF plasma processing device 2 are also monitored. Furthermore, an electrostatic chuck for securing the process object to be processed (a semiconductor wafer) is provided in the process chamber 2a, and the voltage supplied to the electrostatic chuck is monitored. Also, the temperature of coolant gas that is supplied to the electrostatic chuck and controls the temperature of the electrostatic chuck is monitored. In the turbo molecular pump 2b for exhausting gas from the process chamber 2a, the pressure of the exhaust gas is monitored.

While monitoring those conditions, the semiconductor manufacturing device controls each of the process conditions in the semiconductor manufacturing process, so that a desired process is carried out for the process object that is being processed.

In the above conventional monitoring device, each of the process conditions is individually detected and controlled. More specifically, a reference value and a tolerable range are set for each of the process conditions, and a control operation is performed by adjusting the process condition to the reference value or maintaining the process condition within the tolerable range. Here, each of the process conditions is individually controlled, and the correlations between the process conditions are not taken into consideration and therefore are not monitored.

An actual process carried out for a process object is affected by the process conditions closely interrelated with one another. When a large number of process objects are continuously processed, the process conditions affects one another, and the result of the actual process on the process objects might change beyond the tolerable range, even if the process conditions change with time only within the tolerable range. In such a case, even though the actual process conditions as a whole change beyond the normal tolerable range, the process for the process objects are determined to be properly carried out, just because each of the process conditions is within each corresponding tolerable range.

In a semiconductor manufacturing device using the above conventional monitoring device and method, each process object after a process is subjected to test analysis to determine whether the process object is a proper product, i.e., whether the process has been properly performed. In other words, in a semiconductor manufacturing device using the conventional monitoring device, whether the process conditions are in a normal state cannot be checked before an actual process is completed.

A test on a processed object requires a certain period of time. For instance, when a large number of process objects are continuously processed, processed ones are stored until the process for the last process one is completed, and all the processed objects are then subjected to test analysis at once. In this manner, even though the process conditions as a whole move outside the normal range, the process is continued, as long as each of the process conditions is within each corresponding tolerable range. As a result, a large number of process objects are processed under the abnormal process conditions.

DISCLOSURE OF THE INVENTION

The general object of the present inventions is to provide a device and method for monitoring process exhaust gas, a semiconductor manufacturing device, and a system and method for controlling semiconductor manufacturing devices, in which the above described problems with the prior art are eliminated.

A more specific object of the present invention is to provide a process exhaust gas monitoring device and method, which compare the amount of exhaust gas from a process chamber under optimum process conditions with the amount of exhaust gas generated during an actual process, and detect a change in the gas amount to monitor the entire balance among the process conditions, thereby performing a process monitoring operation that is effective with changes over time. A semiconductor manufacturing device equipped with the above monitoring device is also provided by the present invention.

Another specific object of the present invention is to provide a system and method for controlling semiconductor manufacturing device, which can control the semiconductor manufacturing devices with a high precision by accumulating analysis data obtained from an exhaust gas analysis made in the semiconductor manufacturing devices. With this system and method, the semiconductor manufacturing devices can be efficiently operated.

To achieve the above objects, one aspect of the present invention provides a process exhaust gas monitoring device that monitors the amount of each component of process exhaust gas containing a plurality of gas components resulted from a process carried out for a process object under predetermined process conditions. This monitoring device includes:

gas sampling means for sampling the process exhaust gas;
gas analysis means for analyzing each component of the sampled process exhaust gas;
comparison means for comparing an analysis result from the gas analysis means with a reference analysis result of the process exhaust gas generated from a process carried out under reference process conditions; and
detection means for generating and outputting a signal indicating a process error, when it is determined from the comparison result from the comparison means that the amount of at least one gas component of the process exhaust gas has changed to an amount that is outside a predetermined range set around a reference value obtained from the reference analysis result.

With the above device in accordance with the present invention, the components of process exhaust gas are analyzed to presume that there is an error in the process conditions, and if it is determined that there is an error, a signal indicating a process error is outputted. In accordance with this signal, a notification of the error occurrence is sent to the operation manager of the device, prompting the operation manager to adjust the process conditions. The process exhaust gas is a product from an actual process carried out for the process object, and therefore reflects the actual process. Accordingly, compared with a case where each item of the process conditions prior to the process of the process object is adjusted to a target value so as to control the reaction with the process object, a more precise control operation for the process conditions can be performed by adjusting the process conditions based on the components of the process exhaust gas reflecting the actual reaction with the process object.

In the above device in accordance with the present invention, the gas analysis means is preferably a Fourier-transform infrared spectroscope. With the Fourier-transform infrared spectroscope employed as an analysis means having a very high analysis speed, analysis results can be obtained without delay, and the process for the object to be processed can promptly reflect the analysis results. For instance, if an error is caused in the process conditions during a process carried out for process objects in a single lot, the process can be immediately stopped, and the process conditions can be adjusted to the normal state. In this manner, a continuous process on a number of process objects under the unsuitable process conditions can be prevented before too late.

The process exhaust gas monitoring device in accordance with the present invention may further include alarm means for giving an alarm in accordance with the signal outputted from the detection means.

The process exhaust gas monitoring device in accordance with the present invention may further include control means for automatically controlling the process conditions in accordance with the signal outputted from the detection means.

The process exhaust gas monitoring device in accordance with the present invention may further include memory means for storing the analysis result from the gas analysis means. In this process exhaust gas monitoring device, the comparison means compares a plurality of analysis results with the reference analysis result.

The process exhaust gas monitoring device in accordance with the present invention may further include memory means for storing a plurality of reference analysis results. In this process exhaust gas monitoring device, the comparison means compares each of a plurality of analysis results with each corresponding one of the plurality of reference analysis results.

The process exhaust gas monitoring device in accordance with the present invention may further include switch means for switching process exhaust gas passages for sampling the process exhaust gas at a plurality of locations.

The process exhaust gas monitoring device in accordance with the present invention may further include control means for controlling operations of the gas analysis means and the switch means.

The process exhaust gas monitoring device in accordance with the present invention may further include comparison result memory means for storing a comparison data resulted from the comparison means. In this process exhaust gas monitoring device, the comparison means performs a comparison operation for each process by supplying a signal from outside to the control means, and the comparison result memory means stores the comparison data from each process.

The process exhaust gas monitoring device in accordance with the present invention may further include: nitrogen gas supply means for introducing nitrogen gas used in a zero calibration operation for the Fourier-transform infrared spectroscope to gas introduction means of the Fourier-transform infrared spectroscope; and zero-calibration control means for controlling the nitrogen gas supply means so that a zero calibration operation is performed at predetermined regular intervals.

The process exhaust gas monitoring device in accordance with the present invention may further include flow rate adjustment means for adjusting a flow rate of a gas flowing from the gas sampling means to the gas analysis means. This flow rate adjustment means is interposed between the gas sampling means and the gas analysis means.

The process exhaust gas monitoring device in accordance with the present invention may further include alarm means for giving an alarm when the flow rate of the gas flowing from the gas sampling means to the gas analysis means is outside a predetermined range.

In the process exhaust gas monitoring device in accordance with the present invention, a process device that generates the process exhaust gas includes a vacuum pump for exhausting the process exhaust gas. This process exhaust gas monitoring device may further include constant flow rate control means for supplying a constant flow rate of inert gas to the vacuum pump.

Another aspect of the present invention provides a semiconductor manufacturing device that includes:

a process chamber for processing a process object under predetermined process conditions;

exhaust means for exhausting process exhaust gas generated in the process chamber; and the above described process exhaust gas monitoring device that is connected to the exhaust means and monitors the process exhaust gas sampled through the exhaust means.

With the above device in accordance with the present invention, the components of process exhaust gas are analyzed to presume that there is an error in the process conditions, and if it is determined that there is an error, a signal indicating a process error is outputted. In accordance with this signal, a notification of the error occurrence is sent to the operation manager of the device, prompting the operation manager to adjust the process conditions. The process exhaust gas is a product from an actual process carried out for the process object, and therefore reflects the actual process. Accordingly, compared with a case where each item of the process conditions prior to the process of the process object is adjusted to a target value so as to control the reaction with the process object, a more precise control operation for the process conditions can be performed by adjusting the process conditions based on the components of the process exhaust gas reflecting the actual reaction with the process object.

Yet another aspect of the present invention provides a method of monitoring process exhaust gas containing a plurality of gas components generated from a process carried out for a process object under predetermined process conditions. This method includes the steps of:

sampling the process exhaust gas;

analyzing the components of the sampled process exhaust gas;

comparing the gas analysis result with a reference analysis result of an analysis of process exhaust gas generated as a result of a process carried out under reference process conditions; and generating and outputting a signal indicating a process error when it is determined that the amount of at least one gas component of the process exhaust gas has changed to an amount that is outside a predetermined range set around a reference value obtained from the reference analysis result.

With the above method in accordance with the present invention, the components of process exhaust gas are analyzed to presume that there is an error in the process conditions, and if it is determined that there is an error, a signal indicating a process error is outputted. In accordance with this signal, a notification of the error occurrence is sent to the operation manager of the device, prompting the operation manager to adjust the process conditions. The process exhaust gas is a product from an actual process carried out for the process object, and therefore reflects the actual process. Accordingly, compared with a case where each item of the process conditions prior to the process of the process object is adjusted to a target value so as to control the reaction with the process object, a more precise control operation for the process conditions can be performed by adjusting the process conditions based on the components of the process exhaust gas reflecting the actual reaction with the process object.

In the above process exhaust gas monitoring method, the step of analyzing the components of the process exhaust gas may be carried out by a Fourier-transform infrared spectroscope.

The above process exhaust gas monitoring method may further include the step of giving an alarm in accordance with the signal indicating a process error.

The above process exhaust gas monitoring method may further include the step of automatically adjusting process conditions in accordance with the signal indicating a process error.

Still another aspect of the present invention provides a semiconductor manufacturing device control system that includes:

a semiconductor manufacturing device that exhausts exhaust gas during an operation;

a monitoring device for sending analysis data obtained from an analysis made by a Fourier-transform infrared spectroscope on the components of the exhaust gas from the semiconductor manufacturing device, the analysis data being sent to a data communication network; and data accumulation control means that receives the analysis data from the data communication network, determines from the analysis data whether an error exists in process conditions of the semiconductor manufacturing device, transmits a signal indicating an error with a presumed cause of the error to the monitoring device via the data communication network, and accumulates and registers the analysis data in a database.

With the above system in accordance with the present invention, the analysis data obtained from the analysis of exhaust gas components by the Fourier-transform infrared spectroscope are registered in the database of the data accumulation control means via the data communication network. More specifically, the analysis data from various semiconductor manufacturing devices in actual operation at a device manufacturer are immediately registered in the database. The analysis data are then analyzed based on the database, so that an error detecting operation for the process conditions can be performed with a high precision. The detection result is immediately sent to each corresponding semiconductor manufacturing device via the data communication network. In this manner, the operation manager of each semiconductor manufacturing device can be promptly notified of an error.

In the above semiconductor manufacturing device control system in accordance with the present invention, the data accumulation control means may transmit the signal indicating an error and accessory information related to the error to the monitoring device. In this system, the monitoring device displays the error in the process conditions and the cause of the error on a display screen in accordance with the signal indicating the error, and also displays information related to the error on the display screen in accordance with the accessory information.

With this system in accordance with the present invention, the operation manager of each semiconductor manufacturing device can also be provided with information concerning the error, and suitable measures can be immediately taken against the error or any danger accompanying the error.

Yet another aspect of the present invention provides a method of controlling a semiconductor manufacturing device. This method includes the steps of:

sending analysis data obtained from an analysis made by a Fourier-transform infrared spectroscope on components of exhaust gas exhausted from the semiconductor manufacturing device, the analysis data being sent to a data communication network;

determining from the analysis data sent from the data communication network whether an error exists in process conditions for the semiconductor manufacturing device;

transmitting a signal indicating an error and an presumed cause of the error in the process conditions to the semiconductor manufacturing device via the data communication network; and accumulating and registering the analysis data in a database.

With the above method in accordance with the present invention, the analysis data obtained from the analysis of exhaust gas components by the Fourier-transform infrared spectroscope are registered in the database of the data accumulation control means via the data communication network. More specifically, the analysis data from various semiconductor manufacturing devices in actual operation at a device manufacturer are immediately registered in the database. The analysis data are then analyzed based on the database, so that an error detecting operation for the process conditions can be performed with a high precision. The detection result is immediately sent to each corresponding semiconductor manufacturing device via the data communication network. In this manner, the operation manager of each semiconductor manufacturing device can be promptly notified of an error.

In the above semiconductor manufacturing device control method in accordance with the present invention, the signal indicating an error may be provided with accessory information related to the error and then transmitted to the data communication network. In this method, the error in the process conditions and the cause of the error are reported to an operation manager in accordance with the signal indicating the error, and information related to the error is also reported to the operation manager in accordance with the accessory information. With this accessory information, the operation manager of each semiconductor manufacturing device can also be provided with the information concerning the error, and suitable measures can be immediately taken against the error or any danger accompanying the error.

Still another aspect of the present invention provides another method of controlling a semiconductor manufacturing device. This method includes the steps of:

sending analysis data obtained from an analysis made by a Fourier-transform infrared spectroscope on components of exhaust gas exhausted from the semiconductor manufacturing device in operation, the analysis data being sent instantly to an analysis center;

constructing a database by accumulating the analysis data from a plurality of semiconductor manufacturing devices in the analysis center; and controlling each of the plurality of semiconductor manufacturing devices in accordance with the database.

With the above method in accordance with the present invention, semiconductor manufacturing devices in operation at a factory of a semiconductor device manufacturer can be managed at the analysis center. In the analysis center, the database is constructed by gathering and accumulating the analysis data supplied from the semiconductor manufacturing devices in operation at the semiconductor device manufacturer. Using this database, a high-precision managing operation can be performed for the semiconductor manufacturing devices.

BRIEF DESCRIPTION OF THE DRAWINGS

FIG. 5 shows the signal flows in the monitoring device;

FIG. 6 is a part of a flowchart showing the operation of the monitoring device;

FIGS. 19A through 19D are graphs showing the flow rate fluctuations of exhaust gas components and the tolerable ranges thereof, with respect to parameters;

FIG. 20 shows the analysis results obtained from the graphs of FIGS. 19A through 19D;

FIG. 22 shows an example of the display screen of the monitoring device; and

BEST MODE FOR CARRYING OUT THE INVENTION

The following is a description of embodiments of the present invention, with reference to the attached drawings.

Figure 1:
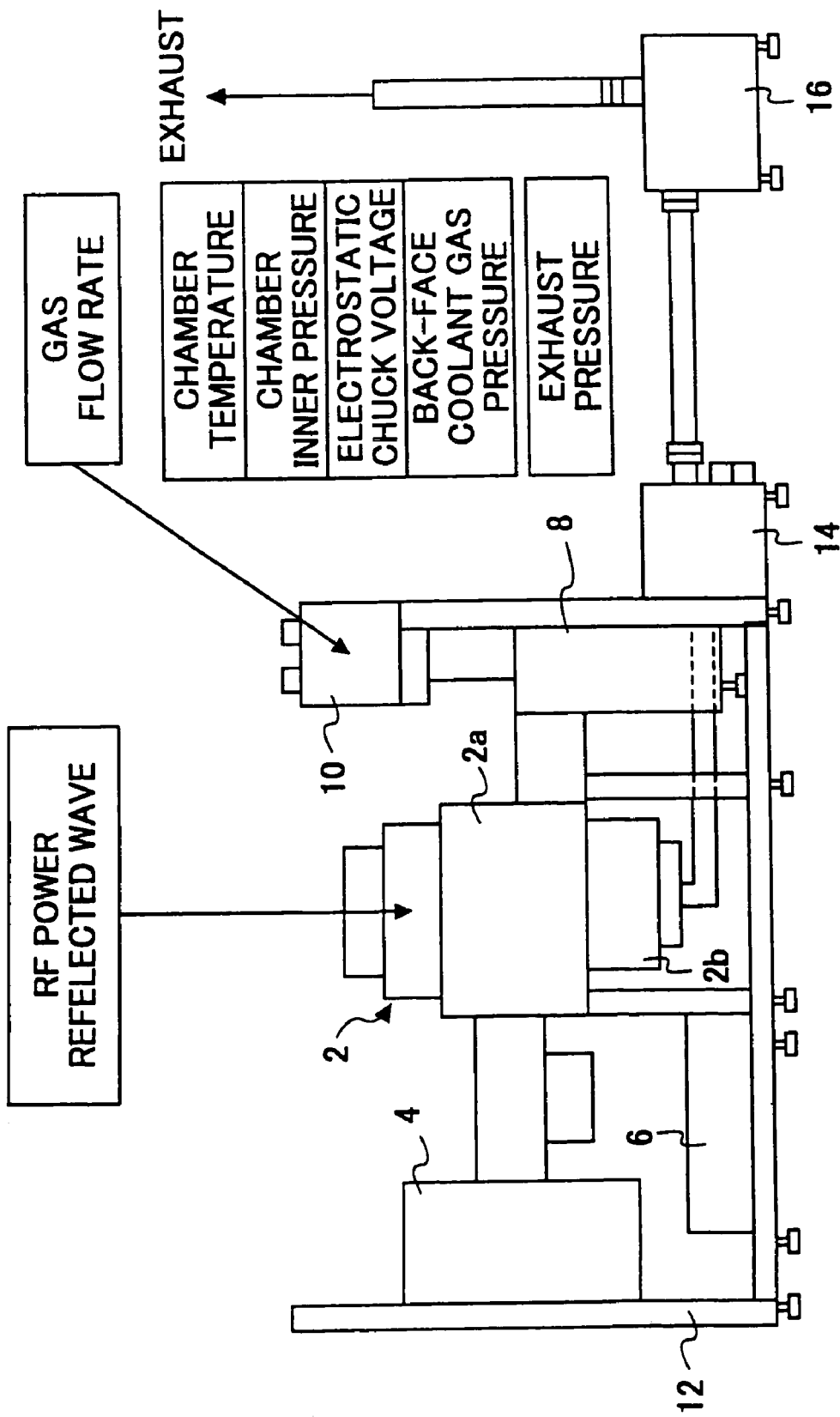
FIG. 1 is a schematic view of the entire structure of a semiconductor manufacturing device that includes a conventional monitoring device.
Figure 2:
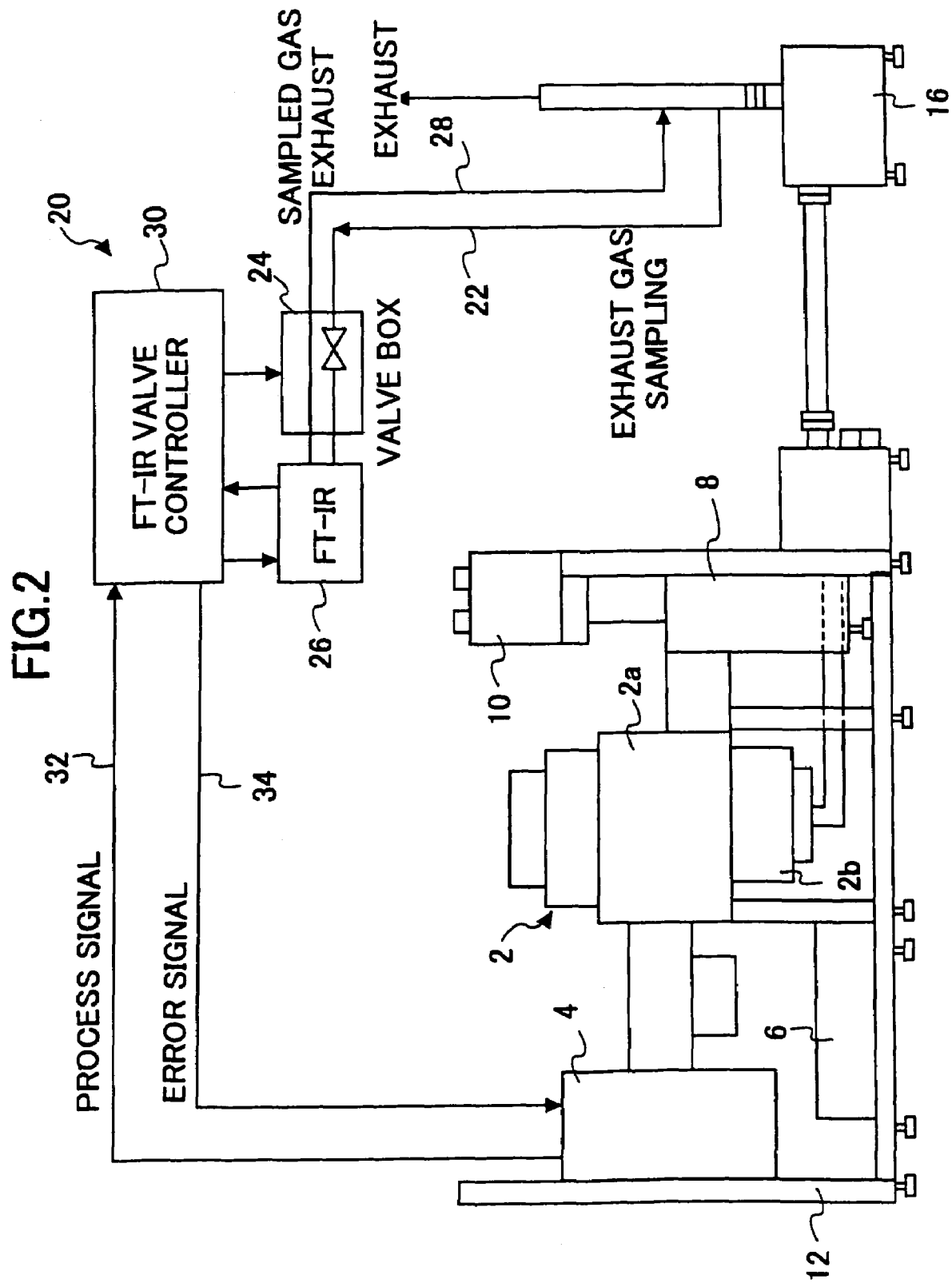
FIG. 2 is a schematic view of the entire structure of a process exhaust gas monitoring device in accordance with a first embodiment of the present invention.

FIG. 2 is a schematic view of the entire structure of a process exhaust gas monitoring device in accordance with a first embodiment of the present invention. In FIG. 2, the same parts as in FIG. 1 are denoted by the same reference numerals, and explanation for those parts will be omitted.

A process exhaust gas monitoring device 20 in accordance with the first embodiment of the present invention samples exhaust gas from a RF plasma processing device 2 through an exhaust gas sampling pipe 22 (gas sampling means) connected to the outlet piping part of a dry pump 16. The exhaust gas sampling pipe 22 is connected to a Fourier-transform infrared spectroscope (FT-IR) 26 (gas analysis means) via a valve box 24 (switch means). The exhaust gas introduced into the Fourier-transform infrared spectroscope 26 via the exhaust gas sampling pipe 22 and the valve box 24 is then subjected to spectrum analysis so as to determine the gaseous components contained in the exhaust gas and the amount of each of the gaseous components. The analyzed exhaust gas is returned to the output part of the dry pump 16 via the sampled gas exhausting pipe 28, and then is discharged to a cleaner device (not shown).

The monitoring device 20 is provided with a FT-IR valve controller 30 (control means), which will be hereinafter referred to simply as "controller 30". The controller 30 controls the operation of the Fourier-transform infrared spectroscope 26 and the operation of the valve box 24, in accordance with a process signal supplied from a controller 4 of a semiconductor manufacturing device via a process signal line 32.

In the monitoring device having the above structure, the Fourier-transform infrared spectroscope 26 analyses the exhaust gas from the semiconductor manufacturing device, and the analysis result data is outputted to the controller 30. The controller 30 in turn compares the analysis result data with reference data. If the amount of at least one component of the exhaust gas greatly deviates from the reference value or does not fall in the reference range, the controller 30 outputs an error signal to the controller 4 of the semiconductor manufacturing device via an error signal line 34.

The controller 4, which has received the error signal, notifies the operator of the semiconductor manufacturing device that there is an error in the process conditions, by means of an alarm device (alarm means) of the semiconductor manufacturing device. The alarm device may be a display or an alarm buzzer provided in the semiconductor manufacturing device.

In the above manner, the monitoring device 20 detects an error in the process conditions from the exhaust gas exhausted from the semiconductor manufacturing device, and gives an alarm. The amount of each gaseous component in the exhaust gas heavily depends on the actual process carried out for a process object that is being processed. If there is a great change in the gaseous components in the exhaust gas, it can be considered that the process on the process object has been changed.

In the monitoring device 20 in accordance with the present invention, the Fourier-transform infrared spectroscope 26 is employed as the gas analysis unit. The Fourier-transform infrared spectroscope 26 can make a high-speed gas component analysis while the process object is processed. In a case where the process conditions change with time while the semiconductor manufacturing device is operating, an error in the process conditions of the semiconductor manufacturing device can be instantly detected (i.e., a defective device is produced), and an alarm can be given based on the detection. When an alarm is given, the operator of the semiconductor manufacturing device stops the operation so as to avoid the production of a defective device. The process conditions for the semiconductor manufacturing device are then adjusted, and the operation of the semiconductor manufacturing device is resumed.

The turbo molecular pump 2b and the dry pump 16 for exhausting exhaust gas from the semiconductor manufacturing device is constantly provided with nitrogen gas, which is not shown in FIG. 2, though. The nitrogen gas is supplied to maintain the turbo molecular pump 2b and the dry pump 16 in a stable operation state. Where the present invention is applied, the amount (or the concentration) of each gas component in the exhaust gas is analyzed, and, therefore, the amount of nitrogen gas supplied to those vacuum pumps should be fixed at a constant level.

Figure 3:
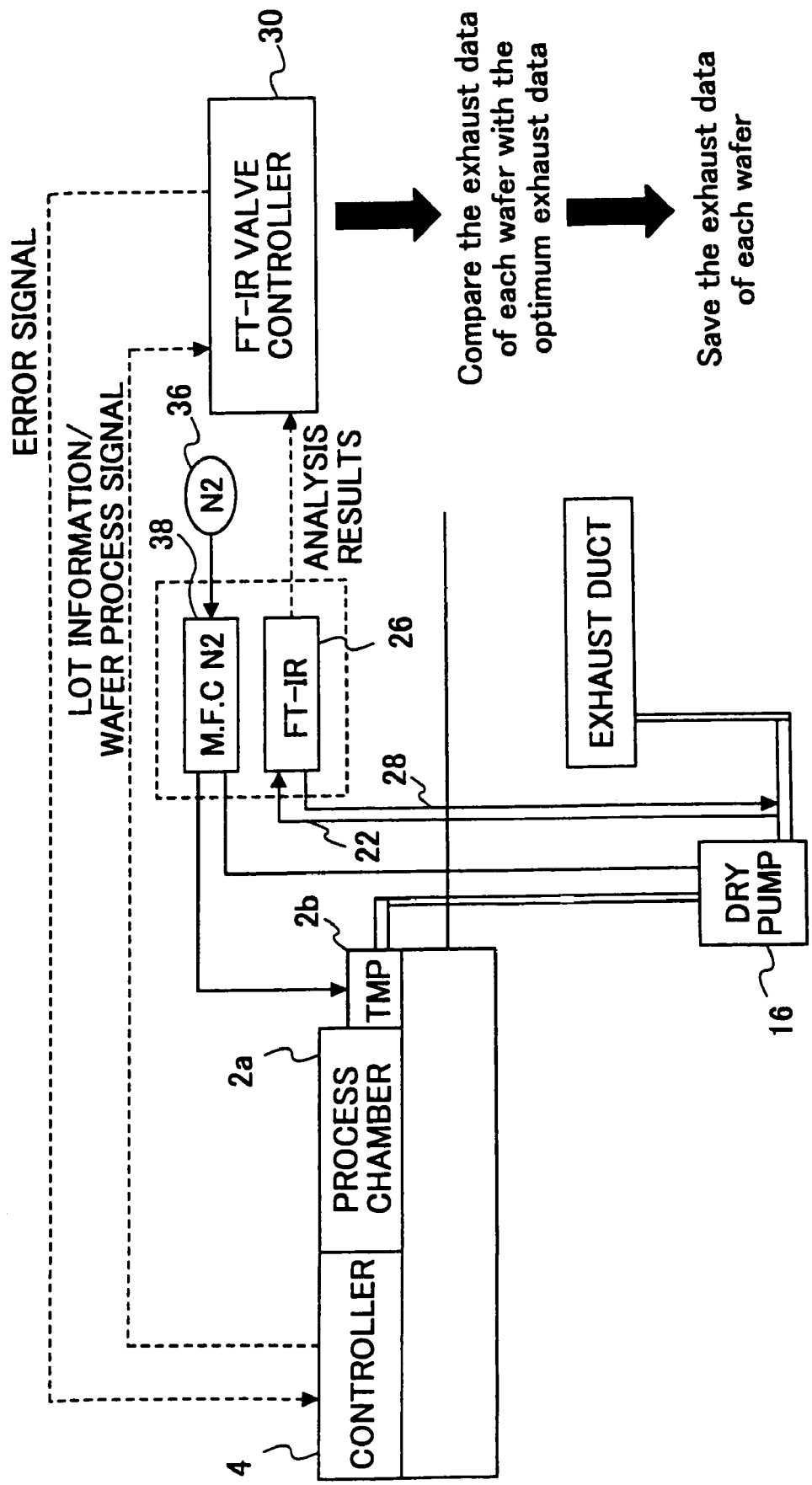
FIG. 3 is a schematic view of the structure of a monitoring device that includes a nitrogen gas supply means.

To do so, a mass flow controller as a constant flow control unit is attached to the valve box 24, so that a fixed amount of nitrogen gas can be constantly supplied to the turbo molecular pump 2b and the dry pump 16. FIG. 3 is a schematic view of the monitoring device including the supply of the nitrogen gas. As shown in FIG. 3, the nitrogen gas is supplied from a nitrogen gas source 36 to the turbo molecular pump 2b and the dry pump 16 via a mass flow controller (MFC) 38. In this embodiment, the mass flow controller 38 is mounted to the valve box 24.

Figure 4:
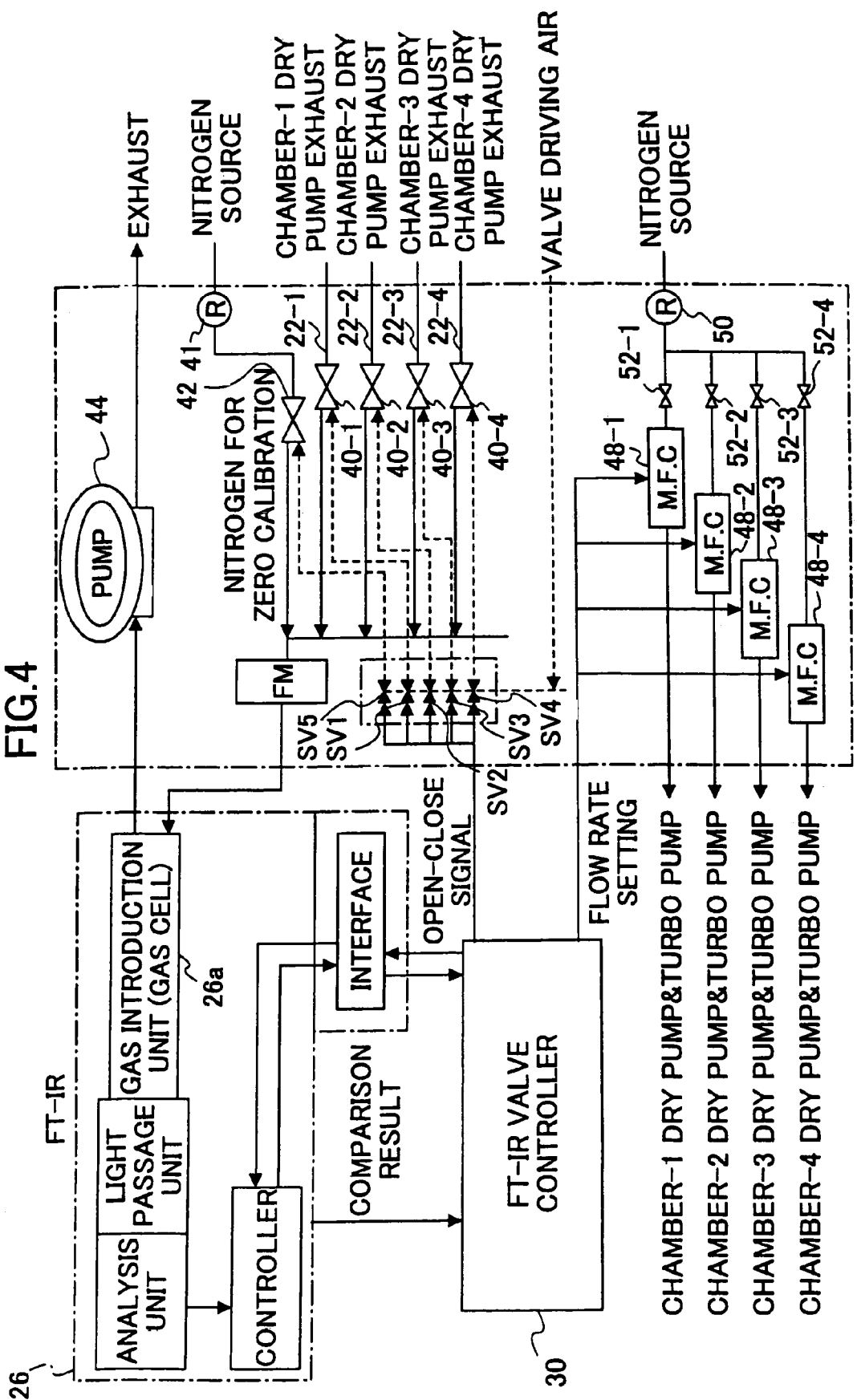
FIG. 4 shows the structure of gas passages in the monitoring device.

Referring now to FIG. 4, the structure of the monitoring device will be described in greater detail.

The monitoring device 20 of this embodiment shown in FIG. 4 monitors exhaust gas exhausted from four semiconductor manufacturing devices. Therefore, four exhaust gas sampling pipes 22-1 through 22-4 are employed, and are connected to a gas introduction unit (a gas cell) 26a of the Fourier-transform infrared spectroscope 26 via switch valves 40-1 through 40-4 (switch means), respectively. The switch valves 40-1 through 40-4 are air-driven open-close valves. The compressed air for valve driving is supplied to each corresponding one of the switch valves 40-1 through 40-4 via solenoid valves SV1 through SV5 that are controlled by an open-close signal supplied from the controller 30.

For instance, when the exhaust gas sampled through the exhaust gas sampling pipe 22-1 in the above structure including the switch valves 40-1 through 40-4, only the switch valve 40-1 is opened, while the other switch valves 40-2 through 40-4 remain closed. In this manner, only one of the switch valves 40-1 through 40-4 is opened while the other switch valves remain closed, so that the exhaust gas sampled through a desired exhaust gas sampling pipe, i.e., the exhaust gas exhausted from a desired process chamber, can be analyzed.

Prior to the gas analysis and measurement, it is necessary to perform a zero calibration or a zero-point adjustment on the Fourier-transform infrared spectroscope 26. The zero calibration is carried out by supplying nitrogen gas to the gas introduction unit 26a. The valve box 24 is provided with an open-close valve 42 for supplying the zero-calibration nitrogen gas to the gas introduction unit 26a of the Fourier-transform infrared spectroscope 26. More specifically, the nitrogen gas for zero calibration is supplied from a nitrogen gas source to the Fourier-transform infrared spectroscope 26 via a regulator 41 and the open-close valve 42. The open-close valve 42 is opened to supply the nitrogen gas to the gas introduction unit 26a, only when the zero calibration is carried out.

The exhaust gas or the zero-calibration nitrogen gas introduced into the gas introduction unit 26a is sucked by a vacuum pump 44 provided in the valve box 24, and then is exhausted.

Like the switch valves 40-1 through 40-4, the open-close valve 42 is driven by the compressed air supplied via the solenoid valve SV5 controlled by an open-close signal transmitted from the controller 30.

As described above, to supply nitrogen to the turbo molecular pump 2b and the dry pump 16, mass flow controllers (MFC) 48-1 through 48-4 are provided in the valve box 24. The mass flow controllers 48-1 through 48-4 are flow meters that can control the flow rates at a constant level, and set each flow rate in accordance with a signal transmitted from the controller 30. As the four semiconductor manufacturing devices each having a process chamber are connected in this embodiment, the four mass flow controllers 48-1 through 48-4 are employed to supply a constant flow rate of nitrogen gas to the turbo molecular pump 2b and the dry pump 16 of each corresponding one of the semiconductor manufacturing devices. More specifically, the nitrogen gas is supplied from the nitrogen gas source to the mass flow controllers 48-1 through 48-4 via the regulator 50 and the open-close valves 52-1 through 52-4, and the nitrogen gas of the flow rate controller by the mass flow controllers 48-1 through 48-4 is supplied to each corresponding one of the semiconductor manufacturing devices (to the dry pump and the turbo molecular pump of each of the chambers 1 through 4).

Referring now to FIG. 5, the operations of the monitoring device 20 in accordance with this embodiment will be described.

In FIG. 5, a process device 60 is a device that performs a predetermined operation on a semiconductor substrate such as a silicon wafer. Various information and signals related to the operation performed in the process device 60 are supplied to the FT-IR valve controller 30. The information and signals supplied from the process device 60 to the FT-IR valve controller 30 include lot information of wafers to be processed, information related to an operation for each wafer, flow rate information for controlling the mass flow controllers 48-1 through 48-4, and signals for checking the operations of the mass flow controllers 48-1 through 48-4.

Based on the information and signals supplied from the process device 60, the FT-IR valve controller 30 supplies operation signals and flow rate setting signals to the valve box 24. More specifically, the operations of the open-close valves 40-1 through 40-4, 42, and 52-1 through 52-4, the operations of the solenoid valves SV1 through SV5, and the operations of the mass flow controllers 48-1 through 48-4 are controlled based on the signals supplied from the FT-IR valve controller 30. By doing so, nitrogen gas (N2) is supplied to the process device 60 to dilute process exhaust gas to a predetermined concentration. This diluted process exhaust gas is sampled and then supplied to the Fourier-transform infrared spectroscope 26 via the valve box 24.

Based on the information and signals supplied from the process device 60, the FT-IR valve controller 30 also supplies operation signals to the Fourier-transform infrared spectroscope 26 so as to actuate the Fourier-transform infrared spectroscope 26. By doing so, the concentration of a predetermined component of the sampled exhaust gas sampled from the process exhaust gas in the process device 60 is analyzed by the Fourier-transform infrared spectroscope 26. The analysis result of the exhaust gas component is then sent from the Fourier-transform infrared spectroscope 26 to the FT-IR valve controller 30.

Upon receipt of the exhaust gas component analysis result, the FT-IR valve controller 30 compares the concentration of the gas component contained in the exhaust gas component analysis result with a reference value. If the concentration of the gas component contained in the exhaust gas component analysis result is determined to be greatly different from the reference value or greatly deviate from a predetermined range containing the reference value, the FT-IR valve controller 30 outputs an exhaust gas component error signal to the process device 60. The FT-IR valve controller 30 may also outputs the exhaust gas component analysis result to an external device.

During the operation of the monitoring device 20, the valve box 24 supplies a contact signal of each flow meter to the FT-IR valve controller 30. Based on the contact signal, the FT-IR valve controller 30 determines whether each flow meter is properly operating. If one of the flow meters is not properly operating, the FT-IR valve controller 30 transmits an MFC flow rate error signal to the process device 60.

The valve box 24 is controlled by the operation signals from the FT-IR valve controller 30 to supply nitrogen ($N_2$) to the Fourier-transform infrared spectroscope 26. By doing so, the zero calibration or the zero-point adjustment is carried out for the Fourier-transform infrared spectroscope 26.

The exhaust gas sample analyzed in the Fourier-transform infrared spectroscope 26 is returned to the process device 60 via the valve box 24, and then exhausted from the process device 60.

Figure 7:
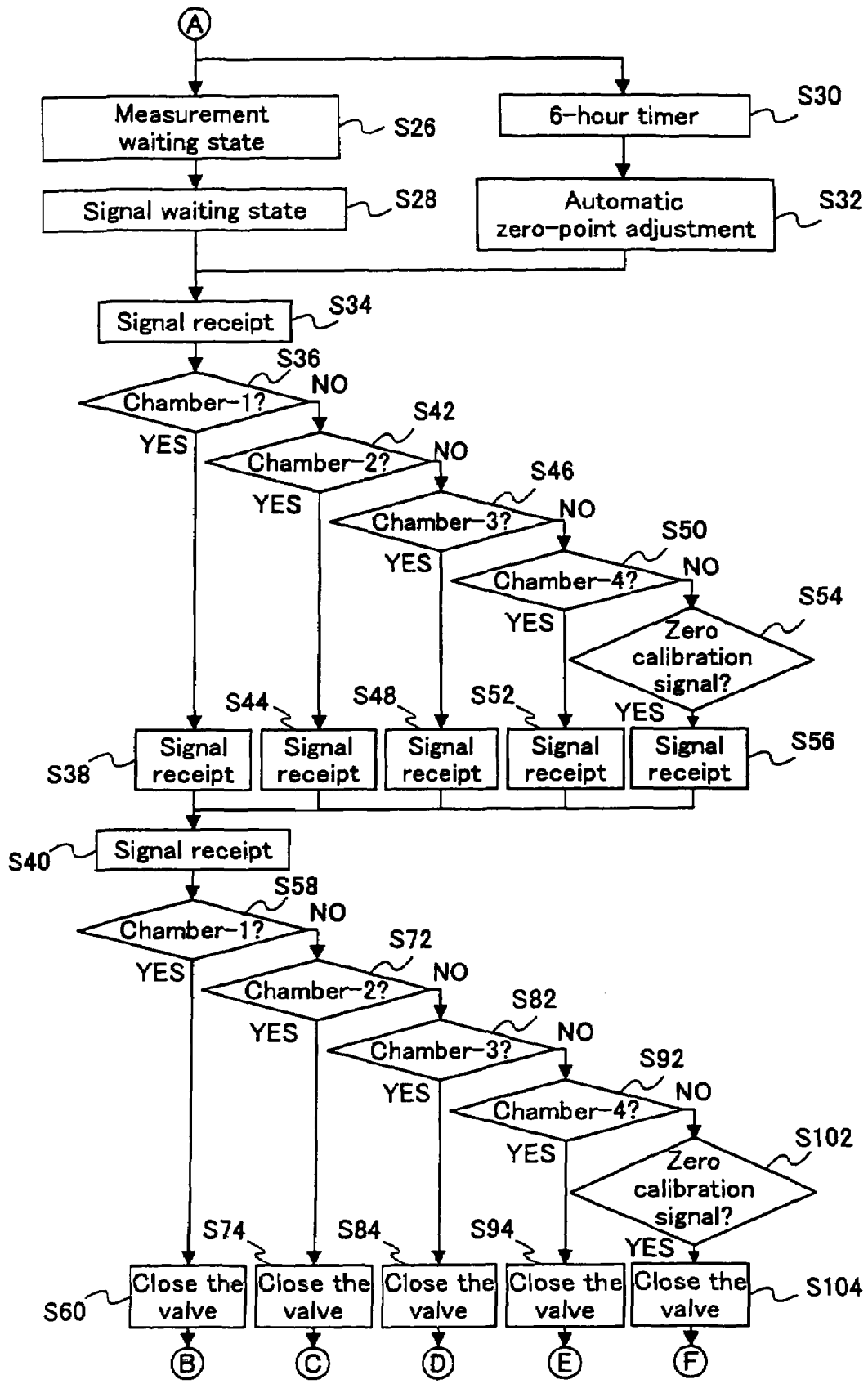
FIG. 7 is another part of a flowchart showing the operation of the monitoring device.
Figure 8:
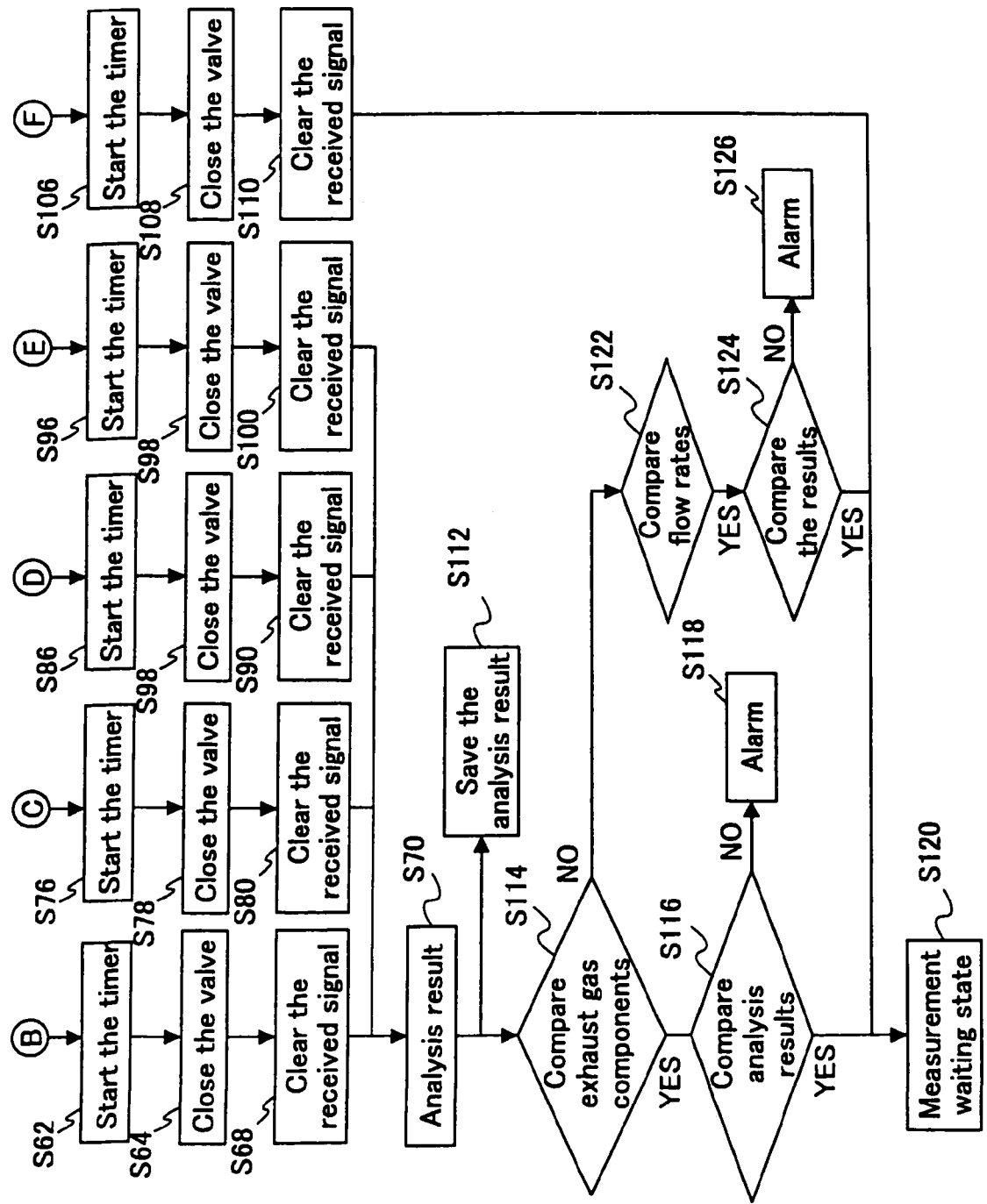
FIG. 8 is yet another part of a flowchart showing the operation of the monitoring device.
Figure 9:
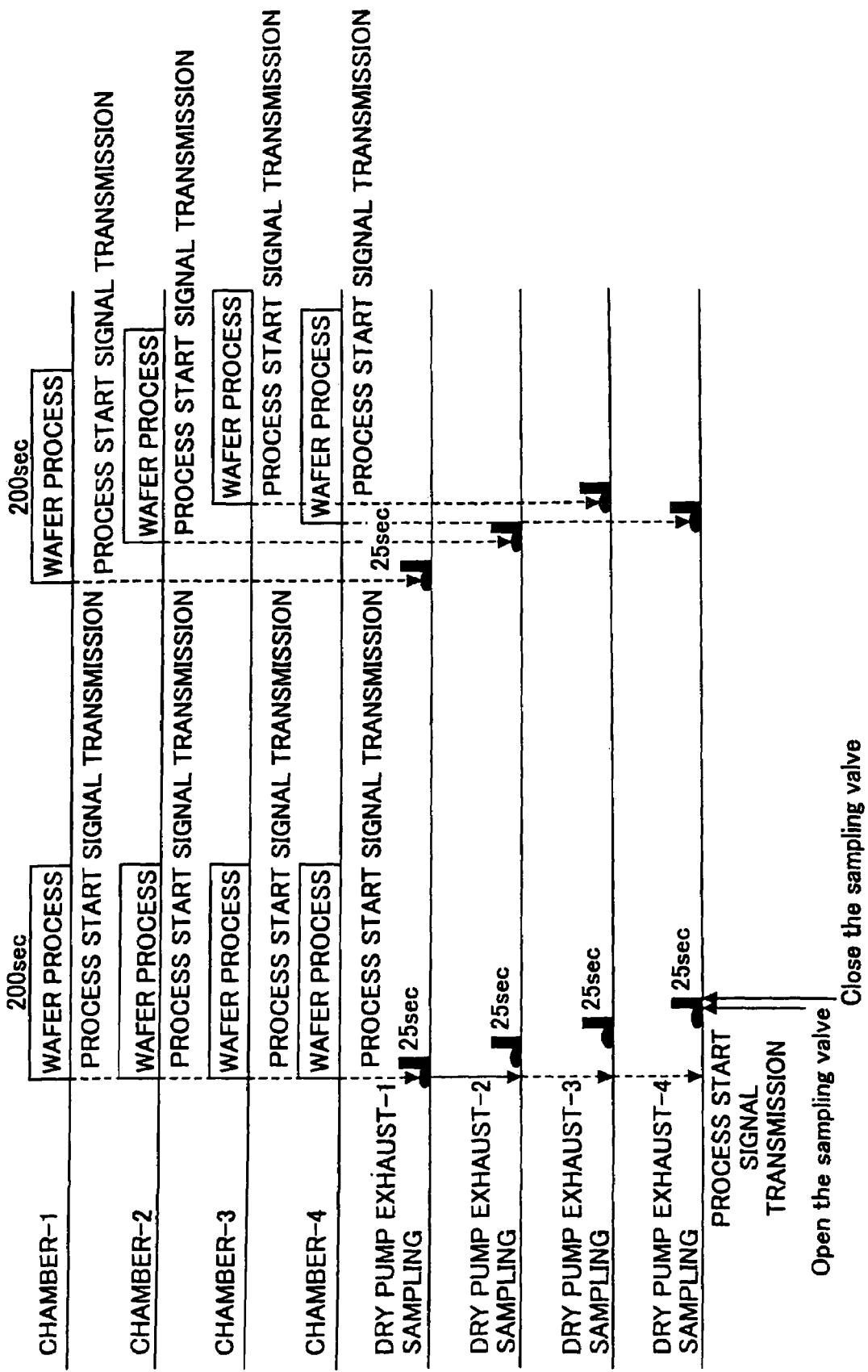
FIG. 9 is a timing chart showing the timings for the processing in the process device and the sampling in the monitoring device.

Referring now to FIGS. 6 through 9, the operations of the monitoring device 20 of this embodiment will be described in greater detail. FIGS. 6 through 8 are a flowchart showing the operations of the monitoring device 20. FIG. 9 is a timing chart showing the timings for the processing in the process device 60 and the sampling in the monitoring device 20.

As shown in FIG. 6, in the initial state, the power source of the FT-IR valve controller 30 is on, all the valves in the valve box 24 are closed, and the vacuum pump 44 is stopped. Here, the initial display image is displayed on a screen mounted to the FT-IR valve controller 30 or a screen mounted to a semiconductor manufacturing device.

In this initial display image, an operator is required to select one of the four modes consisting of a remote mode, a manual mode, a maintenance mode, and a local mode.

The remote mode is a mode for operating the monitoring device 20 under automatic sequence control. In the remote mode, the monitoring device 20 is automatically operated by a predetermined program.

The manual mode is a mode for manually operating the monitoring device 20, and is selected when the zero-point of the Fourier-transform infrared spectroscope 26 is adjusted in the initial adjustment process or the sampling is manually carried out. Also, the manual mode is selected when the zero-point of the Fourier-transform infrared spectroscope 26 is adjusted after a regular checkup, a repair, or an emergency stop.

After the manual mode is selected in step S200, the vacuum pump 44 is actuated in step S202, and the Fourier-transform infrared spectroscope 26 is set in a remote control mode in step S204. A zero-point adjustment operation or a sampling operation is selected. If the zero-point adjustment operation is selected in step S206, the open-close valve 42 for zero-point adjustment is opened in step S208. Nitrogen gas is then supplied to the gas introduction unit 26a of the Fourier-transform infrared spectroscope 26 to perform the zero-point adjustment operation in step S210. After the zero-point adjustment is completed, the open-close valve 42 for zero-point adjustment is closed in step S212, and the zero-point adjustment operation comes to an end in step S214.

If the sampling operation is selected in step S220, the corresponding one of the open-close valves 52-1 through 52-4 and 22-1 through 22-4 to the desired process device is opened in step S222, and the sampling of exhaust gas is carried out in step S224. After the sampling is completed, the open-close valve is closed in step S226, and the sampling operation comes to an end in step S228.

If the maintenance mode is selected in step S300, an operator is required to select a data and information setting operation or a data history editing operation.

If the data setting operation is selected in step S302, an operator changes or sets the desired data or information in step S304, and registers the data or information in step S306. The data or information to be changed or set include the setting of reference data for comparison of each gas component, the setting of data related to alarms, the setting of an alarm range of each gas component, the setting of the sampling data history. On the other hand, if the data history editing operation is selected in step S310, the history is stored in step S312, and the unnecessary history is erased in step S314.

If the local mode is selected from the initial display image in step S400, the signal supply to the FT-IR valve controller 30 is stopped in step S402, and the Fourier-transform infrared spectroscope 26 is controlled to operate only in response to an input from an operator in step S404.

On the other hand, if the remote mode is selected from the initial display mode in step S10, the vacuum pump 44 is actuated in step S12. The Fourier-transform infrared spectroscope 26 is then set in a remote control mode in step S14, and the automatic sampling and the gas component analysis are started in step S16.

After the automatic operations are started, the zero-point adjustment operation is performed for the Fourier-transform infrared spectroscope 26. More specifically, the open-close valve 42 for zero-point adjustment is opened in step S18, and the nitrogen gas is supplied to the gas introduction unit 26a of the Fourier-transform infrared spectroscope 26. The zero-point adjustment timer that has a predetermined open time for the open-close valve 42 is set in step S20, and the zero-point adjustment operation is performed. After the predetermined open time is measured by the zero-point adjustment timer, the open-close valve 42 for zero-point adjustment is closed in step S22, and the zero-point adjustment operation comes to an end in step S24.

The operation of the monitoring device 20 then moves on to the procedures shown in FIG. 7. More specifically, after the zero-point adjustment operation is completed, the monitoring device 20 is put in a stand-by state for the exhaust gas sampling in step S26, and waits for a signal to start the sampling in a signal-waiting state in step S28. Here, to perform the zero-point adjustment operation at regular intervals, a timer is set. In this embodiment, a 6-hour timer is set to perform the zero-adjustment operation every 6 hours in step S30. By doing so, the zero-point adjustment operation for the Fourier-transform infrared spectroscope 26 is automatically performed after the first zero-point adjustment operation is completed, so that the zero point is maintained with precision.

When a signal is received in the signal waiting state in step S34, it is determined whether the received signal is a process start signal from the chamber-1 in step S36. If the received signal is a process start signal from the chamber-1, the received signal is accepted in step S38. If the received signal is not a process start signal from the chamber-1, it is determined whether the received signal is a process start signal from the chamber-2 in step S42. If the received signal is a process start signal from the chamber-2, the received signal is accepted in step S44.

If the received signal is not a process start signal from the chamber-2, it is determined whether the received signal is a process start signal from the chamber-3 in step S46. If the received signal is a process start signal from the chamber-3, the received signal is accepted in step S48. If the received signal is not a process start signal from the chamber-3, it is then determined whether the received signal is a process start signal from the chamber-4 in step S50. If the received signal is a process start signal from the chamber-4, the received signal is accepted in step S52.

If the received signal is not a process start signal from the chamber-4, it is then determined whether the received signal is a zero calibration signal in step S54. If the received signal is a zero calibration signal, the received signal is accepted in step S56.

A priority order is given to the signals accepted in steps S38, S44, S48, and S52. If a plurality of process start signals and a zero calibration signal are received substantially at the same time in step S34, the priority order is set so as to perform the operations in accordance with the signals in order. In this embodiment, the highest priority is given to the chamber-1, followed by the chamber-2, the chamber-3, the chamber-4, and the zero calibration, in this order.

As shown in FIG. 9, when an automatic sampling operation by the monitoring device 20 is started, the operations of the chambers (1) through (4) are also started substantially at the same time, and therefore the process start signals from the chambers (1) through (4) are sent to the monitoring device 20 substantially at the same time. As the sampling of exhaust gas requires approximately 25 seconds, the Fourier-transform infrared spectroscope 26 is occupied by each one chamber at least 25 seconds. It is therefore necessary to set a priority order and perform the sampling operation for one chamber at a time, in a case where a plurality of process start signals are received substantially at the same time. As one operation by one chamber requires approximately 200 seconds, 25 seconds can be allowed for sampling exhaust gas from each of the four chambers. From the second operation, the process start timing differs among the four chambers, and it becomes rare to receive a plurality of process start signals at the same time.

After the priority order is set for the exhaust gas sampling operation, signals are again received in the priority order in step S40.

It is then determined whether the received signal is a process start signal from the chamber-1 in step S58. If the received signal is a process start signal from the chamber-1, the sampling of the exhaust gas exhausted from the chamber-1 is performed. More specifically, the open-close valve 40-1 is opened to introduce the exhaust gas from the chamber-1 into the gas introduction unit 26a of the Fourier-transform infrared spectroscope 26 in step S60.

As the open-close valve 40-1 is opened, the timer is started in step S62, and the open time for the open-close valve 40-1 is set. The open time for the open-close valve 40-1 is approximately 25 seconds, as shown in FIG. 9, and the sampling of the exhaust gas exhausted from the chamber-1 is performed in this timeframe. After the period of time set by the timer has passed, the open-close valve 40-1 is closed in step S64, and the received signal is cleared in step S68.

If the received signal is not a process start signal from the chamber-1, it is determined whether the received signal is a process start signal from the chamber-2 in step S72. If the received signal is a process start signal from the chamber-2, the sampling of the exhaust gas exhausted from the chamber-2 is performed. More specifically, the open-close valve 40-2 is opened to introduce the exhaust gas from the chamber-2 into the gas introduction unit 26a of the Fourier-transform infrared spectroscope 26 in step S74.

As the open-close valve 40-2 is opened, the timer is started in step S76, and the open time for the open-close valve 40-2 is set. The open time allocated for the open-close valve 40-2 is approximately 25 seconds, as shown in FIG. 9, and the sampling of the exhaust gas exhausted from the chamber-2 is performed in this timeframe. After the period of time set by the timer has passed, the open-close valve 40-2 is closed in step S78, and the received signal is cleared in step S80.

If the received signal is not a process start signal from the chamber-2, it is then determined whether the received signal is a process start signal from the chamber-3 in step S82. If the received signal is a process start signal from the chamber-3, the sampling of the exhaust gas exhausted from the chamber-3 is performed. More specifically, the open-close valve 40-3 is opened to introduce the exhaust gas from the chamber-3 into the gas introduction unit 26a of the Fourier-transform infrared spectroscope 26 in step S84.

As the open-close valve 40-3 is opened, the timer is started in step S86, and the open time for the open-close valve 40-3 is set. The open time allocated for the open-close valve 40-3 is approximately 25 seconds, as shown in FIG. 9, and the sampling of the exhaust gas exhausted from the chamber-3 is performed in this timeframe. After the period of time set by the timer has passed, the open-close valve 40-3 is closed in step S88, and the received signal is cleared in step S90.

If the received signal is not a process start signal from the chamber-3, it is then determined whether the received signal is a process start signal from the chamber-4 in step S92. If the received signal is a process start signal from the chamber-4, the sampling of the exhaust gas exhausted from the chamber-4 is performed. More specifically, the open-close valve 40-4 is opened to introduce the exhaust gas from the chamber-4 into the gas introduction unit 26a of the Fourier-transform infrared spectroscope 26 in step S94.

As the open-close valve 40-4 is opened, the timer is started in step S96, and the open time for the open-close valve 40-4 is set. The open time allocated for the open-close valve 40-4 is approximately 25 seconds, and the sampling of the exhaust gas exhausted from the chamber-4 is performed in this timeframe. After the period of time set by the timer has passed, the open-close valve 40-4 is closed in step S98, and the received signal is cleared in step S100.

If the received signal is not a process start signal from the chamber-4, it is then determined whether the received signal is a zero calibration signal in step S102. If the received signal is a zero calibration signal, the zero-point adjustment operation for the Fourier-transform infrared spectroscope 26 is performed. More specifically, the open-close valve 42 is opened to introduce nitrogen gas from the nitrogen gas source into the gas introduction unit 26a of the Fourier-transform infrared spectroscope 26 in step S104.

As the open-close valve 42 is opened, the timer is started in step S106, and the open time for the open-close valve 42 is set. The zero calibration operation for the Fourier-transform infrared spectroscope 26 is performed in this timeframe. After the period of time set by the timer has passed, the open-close valve 42 is closed in step S108, and the received signal is cleared in step S110. The monitoring device 20 is then put into a measurement waiting state in step S120.

As the receives signal is cleared in each of steps S68, S80, S90, and S100, the sampled exhaust gas is subjected to gas analysis, and the analysis result is obtained in step S70. The analysis result is stored in step S112, while it is determined whether each component of the exhaust gas is to be compared with a reference value in step S114. If the comparison with a reference value is made, it is then determined whether the analysis result is within a tolerable range with respect to the reference value in step S116. If the analysis result is within the tolerable range, the monitoring device 20 is put in the measurement waiting state in step S120.

If the analysis result is outside the tolerable range, an alarm signal indicating an error is sent to the semiconductor manufacturing device, so that an alarm is given to notify that an error exists in the process conditions in step S118.

If it is determined that each component of the exhaust gas is not to be compared with the reference value, it is then determined whether the flow rate of the exhaust gas is to be checked in step S122. If it is determined that the flow rate is to be checked, the flow rate of the entire exhaust gas is measured and then compared with a reference value, so as to determine whether the flow rate is in a tolerable range in step S124. If the flow rate of the exhaust gas is outside the tolerable range, a signal indicating an error in the process conditions is sent to the process device so as to give an alarm in step S126. If the flow rate of the exhaust gas is within the tolerable range, the monitoring device 20 is put in the measurement waiting state in step S120.

In the above described manner, the components of the exhaust gas are analyzed by a Fourier-transform infrared spectroscope (FT-IR) immediately after the exhaust gas is exhausted. If the amount of each component of the exhaust gas is outside the normal range, an error is detected from the process conditions, and a signal indicating an error is outputted. With the alarm unit that gives an alarm in accordance with the signal indicating an error, the fact that there is an error existing in the process conditions can be instantly notified to an operation manager of the semiconductor manufacturing device.

As the Fourier-transform infrared spectroscope (FT-IR) can analyze the components of the exhaust gas in a short period of time, an exhaust gas analysis can be made during a 1-lot wafer process in the semiconductor manufacturing device. If there is a change in the process conditions during the 1-lot wafer process and the change is not within the tolerable range, an alarm is immediately given to stop the operation of the semiconductor manufacturing device and correct the process conditions. Unlike the prior art in which 1-lot wafers is examined and analyzed to determine whether a process has been properly performed on the wafer after the process on the wafer is completed, an error in the process conditions is detected without delay, and the process conditions can be corrected during the process on the 1-lot wafers. Accordingly, a further processing on the wafer under the abnormal process conditions can be prevented, and production of wafers having defects can be avoided.

In this embodiment, the error detection is carried out based on a change in each component of the exhaust gas generated as a result of a process, instead of the error detection by directly monitoring each item of the process conditions. By doing so, all changes in the process conditions can be monitored at once, and the process conditions can be efficiently controlled. For instance, if the flow rate of a gas component amount the process conditions is outside a predetermined tolerable range, another gas component can compensate for the error, and the entire operation can be performed under the normal process conditions. The process conditions, such as the flow rate, the pressure, and the temperature of each process gas, are closely interrelated with each other, and therefore a change in one of the process conditions affects the other process conditions. If each of the process conditions is monitored separately from one another in such a case, merely an item outside the tolerable range of the process conditions leads to a decision that an error exists in the process conditions, even though a normal operation is being performed as a whole, i.e., a normal wafer is being manufactured. In this embodiment, however, each gas component result is compared with the exhaust gas components obtained from a normal process, so as to determine whether the process conditions maintain the normal tolerable range as a whole. In this manner, a process error can be detected suitably in practical use, and unnecessary detection of a process error can be avoided.

Next, the explanation moves on to a second embodiment of the present invention.

Figure 10:
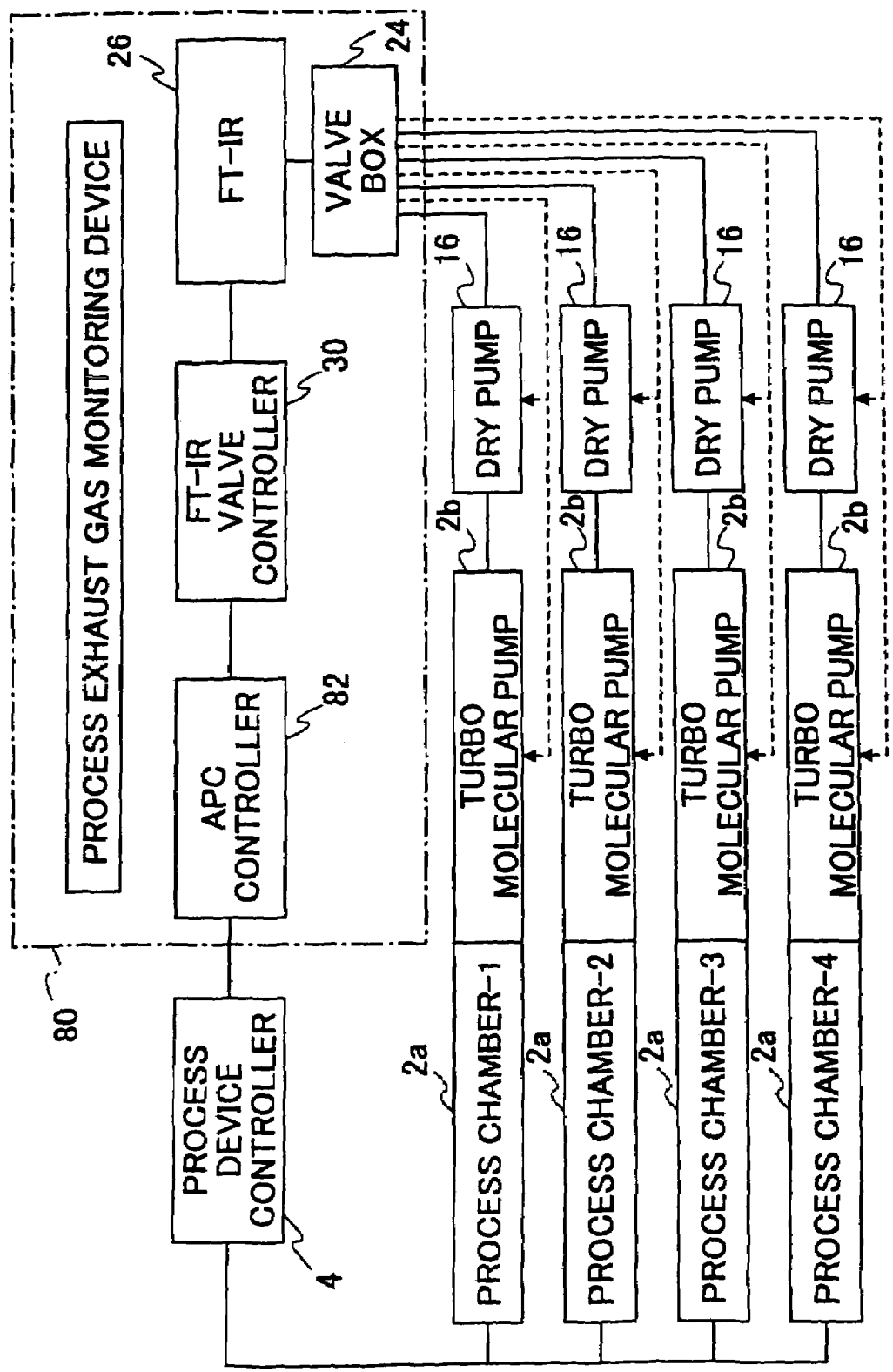
FIG. 10 is a block diagram showing the entire structure of a semiconductor manufacturing system that includes a process exhaust gas monitoring device in accordance with a second embodiment of the present invention.

FIG. 10 is a block diagram showing the entire structure of a semiconductor manufacturing system that includes a process exhaust gas monitoring device 80 in accordance with the second embodiment of the present invention. In FIG. 10, the same components as in FIG. 2 are denoted by the same reference numerals as in FIG. 2, and explanation for those components will be omitted from the following description.

The monitoring device 80 of this embodiment has the same structure as the monitoring device 20, except for the addition of an APC controller 82. The APC controller 82 receives process information from a process device, and supplies the information to the FT-IR valve controller 30. The APC controller 82 also has a function of displaying and recording exhaust gas component analysis results. In this embodiment, the analysis result of each exhaust gas component is compared with a reference analysis result, so as to display the information as to which item of the process conditions should be corrected.

As shown in FIG. 10, the APC controller 82 is interposed between the process device controller 4 and the FT-IR valve controller 30, so as to receive and store various information on a wafer process from the process device controller 4, and to supply necessary information for exhaust gas sampling to the FT-IR valve controller 30. The APC controller 82 also receives the exhaust gas component analysis results from the FT-IR valve controller 30, and then displays and records the results.

Figure 11:
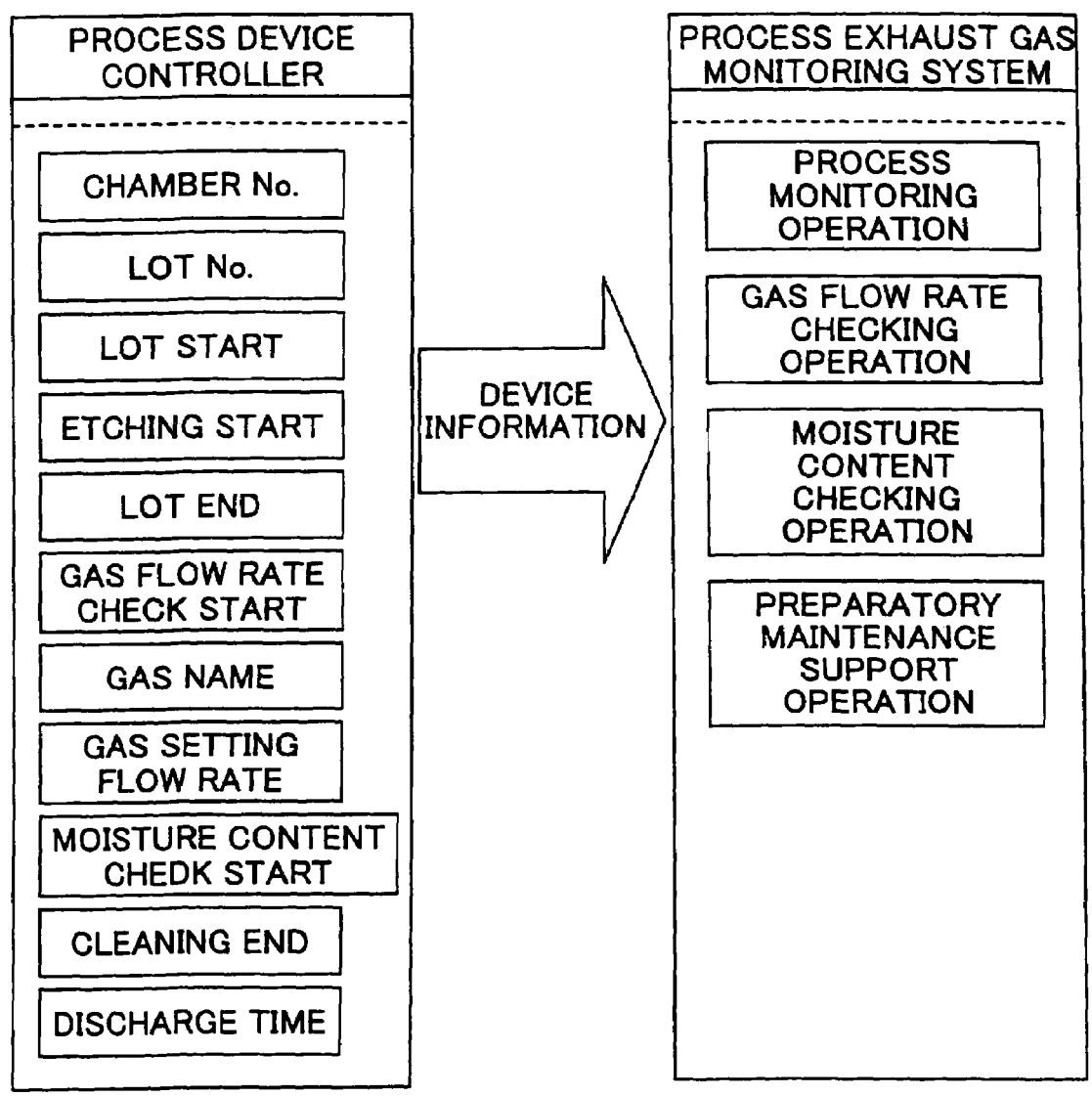
FIG. 11 shows a monitoring function of the monitoring device of the second embodiment.

FIG. 11 shows the monitoring function of the monitoring device 80. The process device controller 4 of the semiconductor manufacturing device supplies various information (device information) concerning wafer processing to the monitoring device 80. In accordance with the device information, the monitoring device 80 performs various operations. The operations to be performed by the monitoring device 80 include a process gas monitoring operation, a gas flow rate checking operation, a moisture content checking operation, a preparatory maintenance support operation. The device information to be supplied from the process device controller 4 to the monitoring device 80 includes a chamber number, a lot number, a lot process start time, an etching start time, a lot process end time, a gas flow rate check start time, a process gas name, a flow rate of process gas, moisture content check start time, a cleaning end time, and a discharge time.

Figure 12:
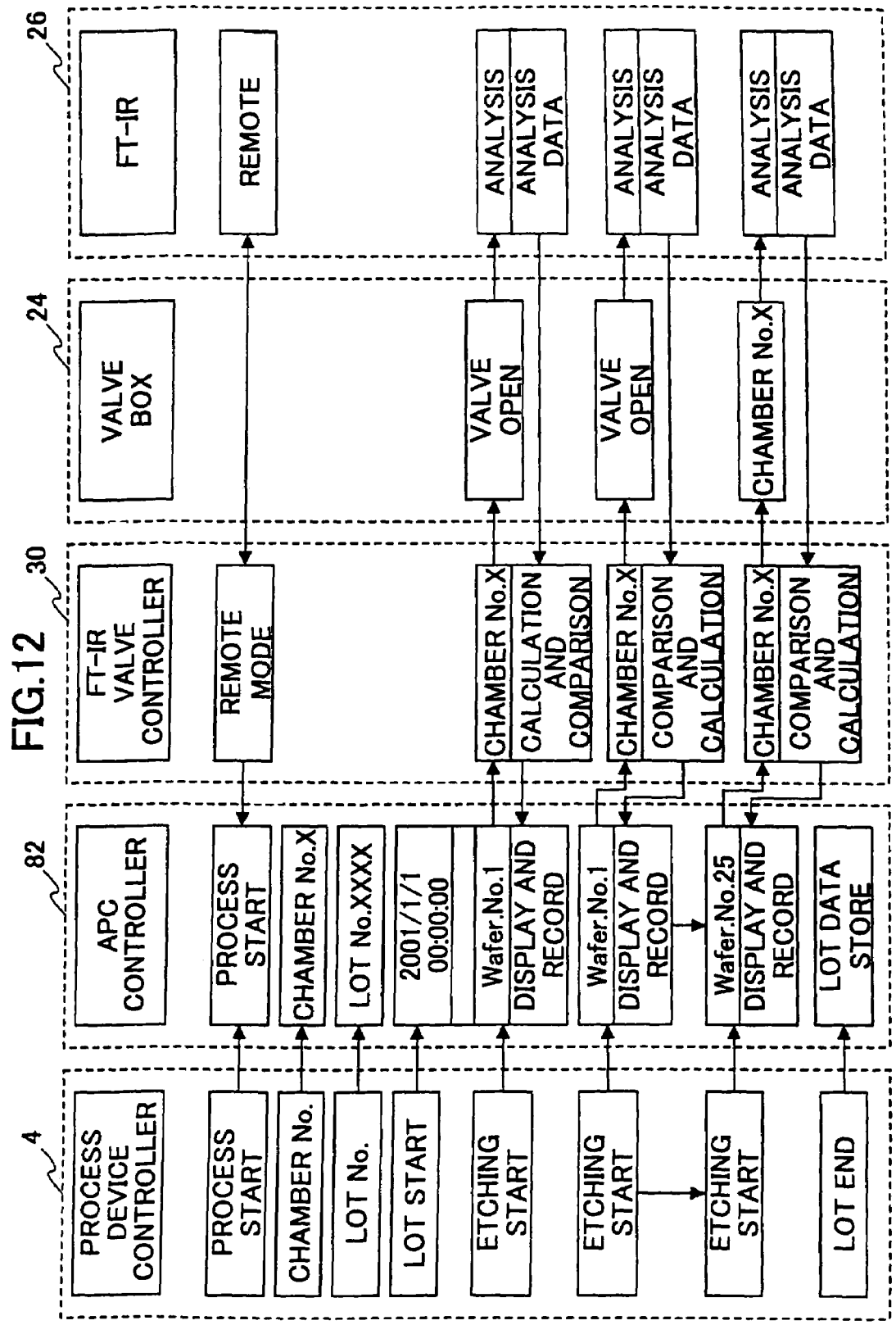
FIG. 12 shows the operation of each part of the monitoring device when a process monitoring operation is performed.
Figure 13:
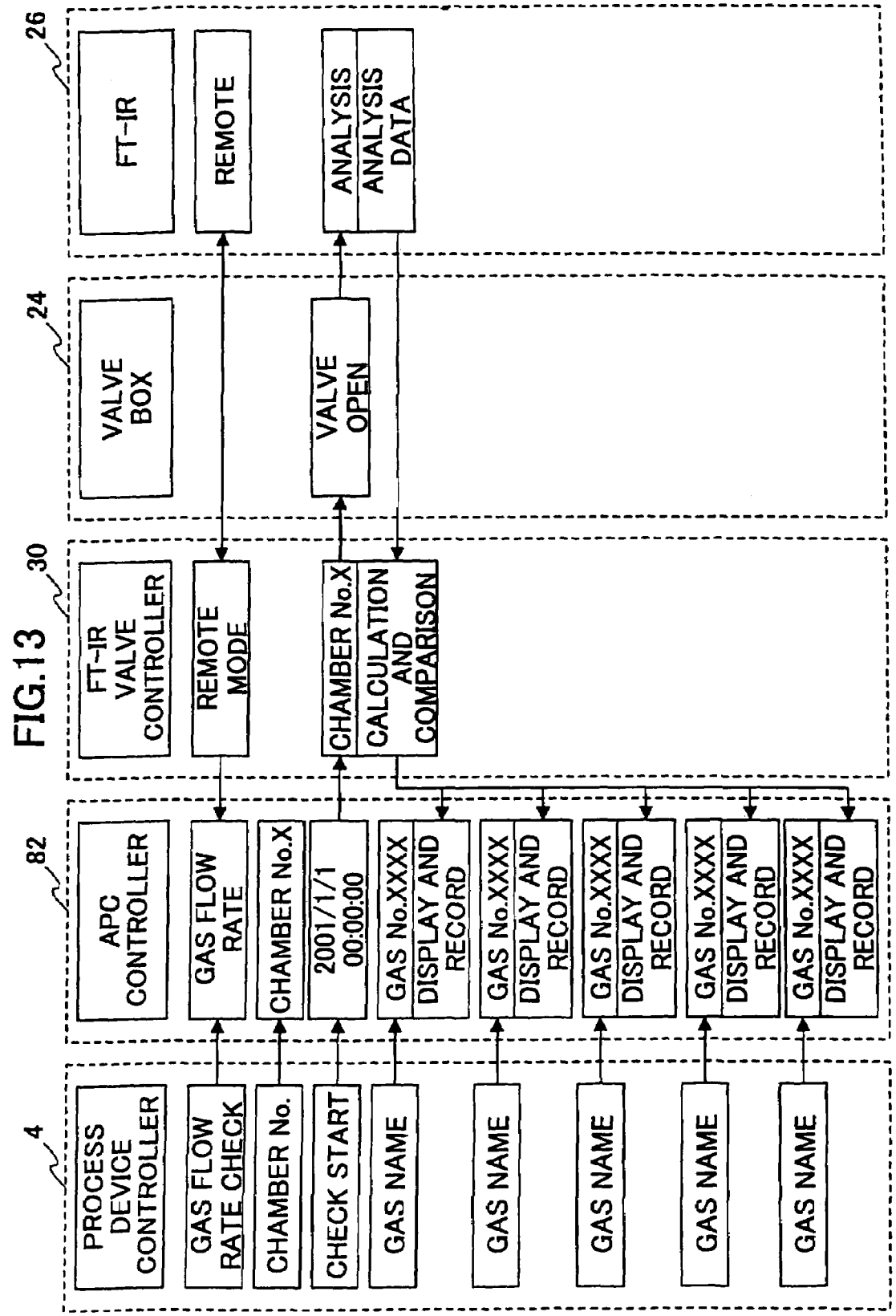
FIG. 13 shows the operation of each part of the monitoring device when a gas flow rate checking operation is performed.
Figure 14:
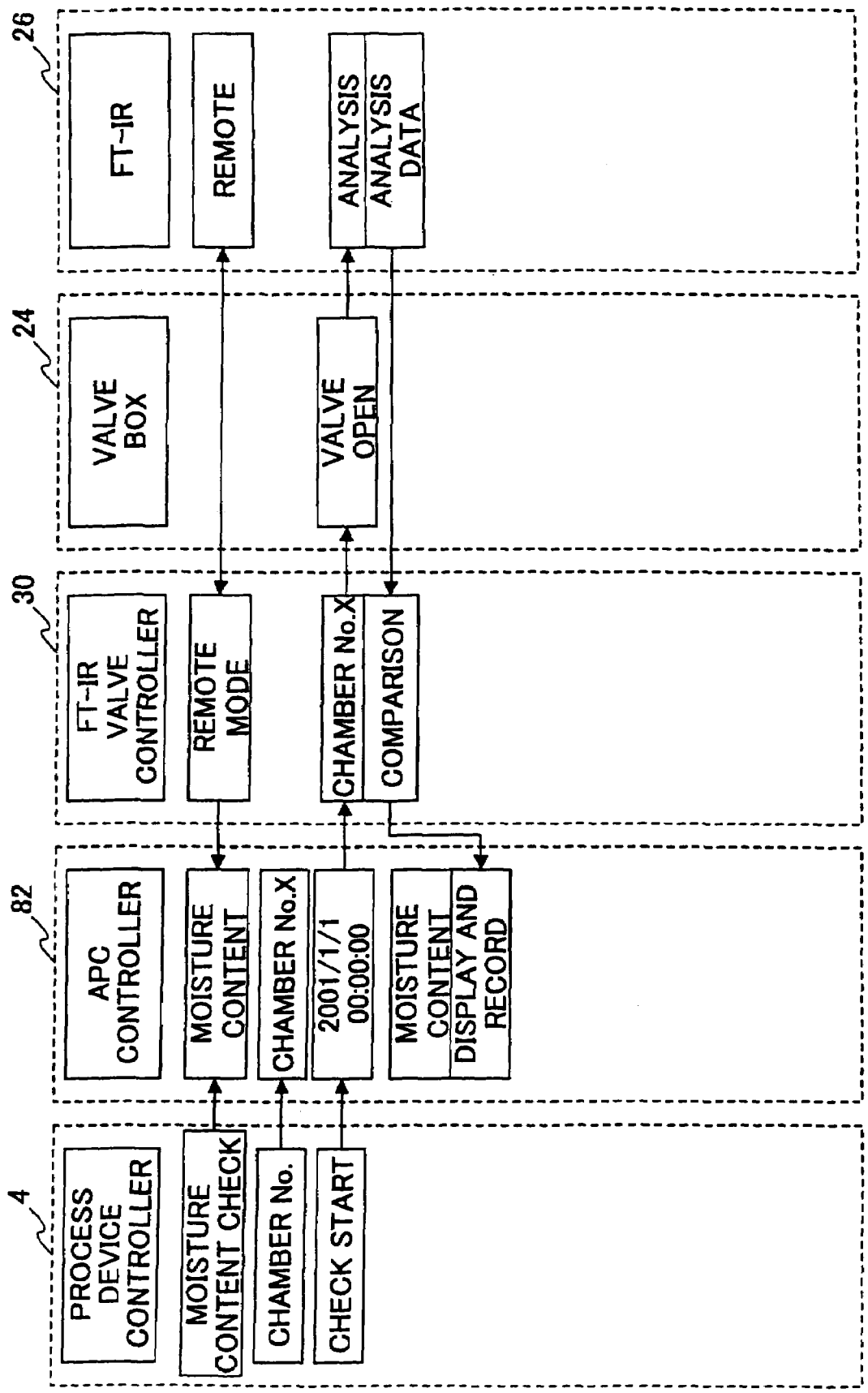
FIG. 14 shows the operation of each part of the monitoring device when a moisture content checking operation is performed.

Referring now to FIGS. 12 through 14, the operations to be performed by the monitoring device 80 will be described in detail.

Referring to FIG. 12, the process monitoring operation will be first described. FIG. 12 shows the operation of each component of the monitoring device 80 when the process monitoring operation is performed.

As the process device controller 4 notifies the APC controller 82 in the monitoring device 80 of a process start, the APC controller 82 starts monitoring the process. In the example shown in FIG. 12, an automatic monitoring function is on, and the FT-IR valve controller 30 is in the remote mode. The Fourier-transform infrared spectroscope 26 is in remote control. The process device controller 4 then sends information, such as the chamber number of the chamber being monitored, the lot number of the wafer being processed, and the time at which the process of the lot is started, to the APC controller 82 in the monitoring device 80. As the process on the wafer No. 1 is started in the process device, the wafer number and a process start signal are sent to the APC controller 82. Here, it is assumed that the process on the wafer carried out in the process chamber is an etching process.

The APC controller 82 then sends the chamber number of the chamber on which the etching process to be monitored is carried out for the FT-IR valve controller 30. In the example shown in FIG. 12, the wafer No. 1 is processed in the chamber No. X. Accordingly, the Fourier-transform infrared spectroscope 26 sends an instruction to the valve box 24 to open the open-close valve (equivalent to a corresponding one of the open-close valves 40-1 through 40-4 shown in FIG. 4) corresponding to the chamber No. X.

In compliance with the instruction, the open-close valve is opened, and the process exhaust gas from the chamber No. X is supplied to the Fourier-transform infrared spectroscope 26. The Fourier-transform infrared spectroscope 26 analyzes the components and the flow rate of the process exhaust gas, and sends the analysis data to the FT-IR valve controller 30. The FT-IR valve controller 30 in turn compares the analysis data with a reference value to determine whether the analysis data is in a tolerable range based on the reference value. The comparison result is sent to the APC controller 82, and is then displayed and recorded.

The etching process for the wafer No. 2 is then started in the process chamber No. X in the same manner as the above described process for the wafer No. 1. More specifically, the open-close valve corresponding to the chamber No. X is opened, and the process exhaust gas from the chamber No. X is sampled and subjected to analysis. The analysis data is sent to the FT-IR valve controller 30, which then compares the analysis data with a reference value. The comparison data is sent to the APC controller 82, and is then displayed and recorded.

While the wafers of a single lot are processed one by one, the components of the process exhaust gas are monitored, and are displayed and recorded by the APC controller 82 in the above described manner. After the processing of the wafers of a single lot is completed, the APC controller 82 stores lot data containing the analysis data and the comparison data of each wafer in a predetermined memory device.

FIG. 13 shows the operation of each part of the monitoring device 80 when a gas flow rate checking operation is performed.

As the process controller 4 issues an instruction to perform a gas flow rate checking operation, the APC controller 82 determines whether the flow rate of each gas contained in the exhaust gas exhausted from the process chamber that is not operating is in a normal range. In other words, the APC controller 82 determines whether the flow rate of each process gas supplied to the process chamber is in the normal range. Here, the FT-IR valve controller 30 is in the remote mode, an the Fourier-transform infrared spectroscope 26 can be remotely controlled.

First, the process device controller 4 sends the chamber number of the process chamber to be checked and a flow rate check start signal to the APC controller 82. Here, the chamber number of the process chamber to be checked is "X". The process device controller 4 also notifies the APC controller 82 of the name of each process gas.

The APC controller 82 records the date and time for starting the flow rate checking operation, and sends the chamber No. X and a flow rate check start signal to the FT-IR valve controller 30. The FT-IR valve controller 30 controls the valve box 24 to open the open-close valve corresponding to the chamber No. X (among the open-close valves 40-1 through 40-4 shown in FIG. 4). As the open-close valve corresponding to the chamber No. X is opened, the process gas supplied to the chamber No. X is supplied directly to the Fourier-transform infrared spectroscope 26. The Fourier-transform infrared spectroscope 26 then analyzes the components of the process gas and determines the flow rate of each gas component.

The analysis data obtained by the Fourier-transform infrared spectroscope 26 is sent to the FT-IR valve controller 30, which then compares each gas component with a predetermined set value. The comparison results are sent to the APC controller 82, which displays and records the comparison results with the gas names provided by the process device controller 4.

FIG. 14 shows the operation of each part of the monitoring device 80 when a moisture content checking operation is performed.

As the process device controller 4 issues an instruction to perform a moisture content checking operation, the APC controller 82 determines whether the moisture content in the exhaust gas exhausted from the process chamber that is not operating is within a normal range. In other words, the APC controller 82 determines whether a certain amount of moisture remains in the process chamber. Here, the FT-IR valve controller 30 is in the remote mode, and the Fourier-transform infrared spectroscope 26 can be remotely controlled.

The process device controller 4 first sends the chamber number of the process chamber to be checked and a moisture content check start signal to the APC controller 82. Here, the chamber number of the process chamber to be checked is "X".

Upon receipt of the moisture content check start signal, the APC controller 82 records the date and time for starting the moisture content checking operation, and supplies a moisture content check start signal, as well as the chamber number "X", to the FT-IR valve controller 30. The FT-IR valve controller 30 in turn controls the valve box 24 to open the open-close vale corresponding to the chamber No. X (among the open-close valves 40-1 through 40-4 shown in FIG. 4). As the open-close valve corresponding to the chamber No. X is opened, the process gas supplied to the chamber No. X is supplied directly to the Fourier-transform infrared spectroscope 26. The Fourier-transform infrared spectroscope 26 analyzes the process gas and determines the moisture content in the process gas.

The analysis data obtained by the Fourier-transform infrared spectroscope 26 is sent to the FT-IR valve controller 30, and then is compared with a reference moisture content value. The comparison result is sent to the APC controller 82, which then displays and records the moisture content in the process chamber.

Figure 15:
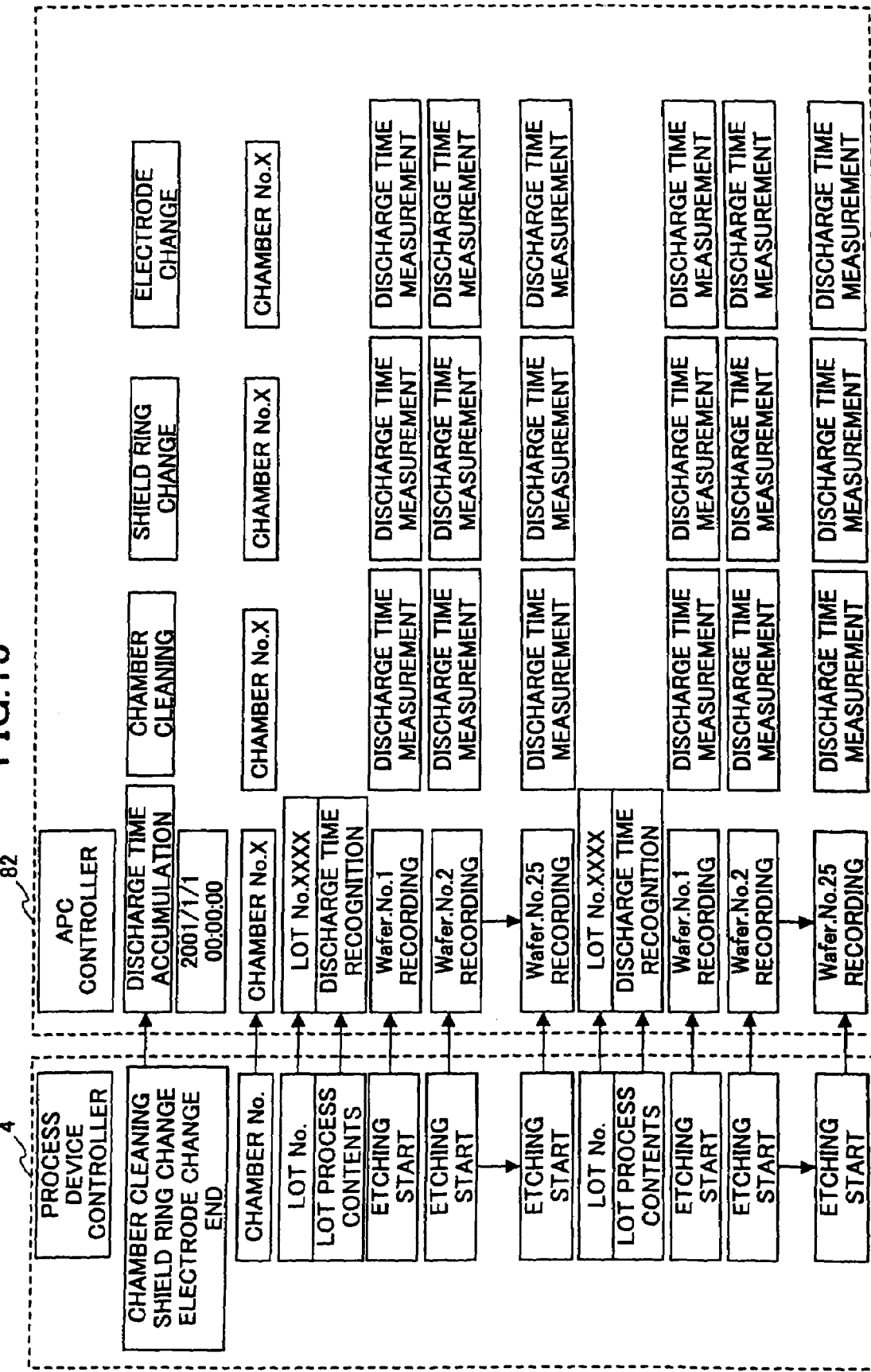
FIG. 15 shows the operation of an APC controller in the monitoring device when a preparatory maintenance support operation is performed.

FIG. 15 shows the operation of the APC controller 82 of the monitoring device 80 when a preparatory maintenance support operation is performed.

The maintenance of each process chamber needs to be carried out at regular intervals. For instance, each process chamber needs to be cleaned at regular intervals, the shield ring of each process chamber needs to be changed for a new one at regular intervals, and the electrode of each chamber need to be changed for a new one at regular intervals. To carry out the maintenance, the APC controller 82 edits and holds the operation history of each process chamber. After a predetermined period of operation time has passed, a massage is displayed on the display screen so as to prompt the operator of the device to carry out the maintenance.

In the example shown in FIG. 15, the maintenance of each process chamber of a plasma process device is carried out. The process device controller 4 first sends information concerning the maintenance of each process chamber to the APC controller 82. In the example shown in FIG. 15, the maintenance information includes the time intervals for cleaning each chamber, the time intervals for changing shield rings, and the time intervals for changing electrodes.

Based on the maintenance information, the APC controller 82 accumulates the operation time of each process chamber, and stores the accumulated time as information. In the example shown in FIG. 15, the operation time of each process chamber is equal to the discharge time of the electrode of the process chamber. Accordingly, the APC controller 82 determines the discharge time of each process chamber from the discharge time information supplied from the process device controller 4, and then accumulates the discharge times.

More specifically, in accordance with lot process contents (process contents information for the wafers in a single lot) supplied from the process device controller 4 for the process chamber No. X, the APC controller 82 recognizes the discharge time necessary for a process to be carried out. Every time an etching process is started for a wafer in the lot, the discharge time is accumulated. The discharge time is measured for each of the maintenance items including the cleaning of the process chamber No. X, the changing of shield rings, and the changing of electrodes. The accumulated discharge time is then recorded.

When the accumulated discharge time for each maintenance item reaches a predetermined time, the APC controller 82 displays a message to prompt the operator of the device to carry out the maintenance.

Referring now to FIGS. 16 through 20, the above process monitoring operations will be described in greater details. In the process monitoring operations, items to be corrected among the process conditions are determined based on the fluctuations of the flow rates of gas components contained in the process exhaust gas. Here, the process device is an RF plasma process device, and the exhaust gas components to be analyzed are $C_2H_6$, $C_2F_4$, $SiF_4$, and $CH_4$.

Figure 16:
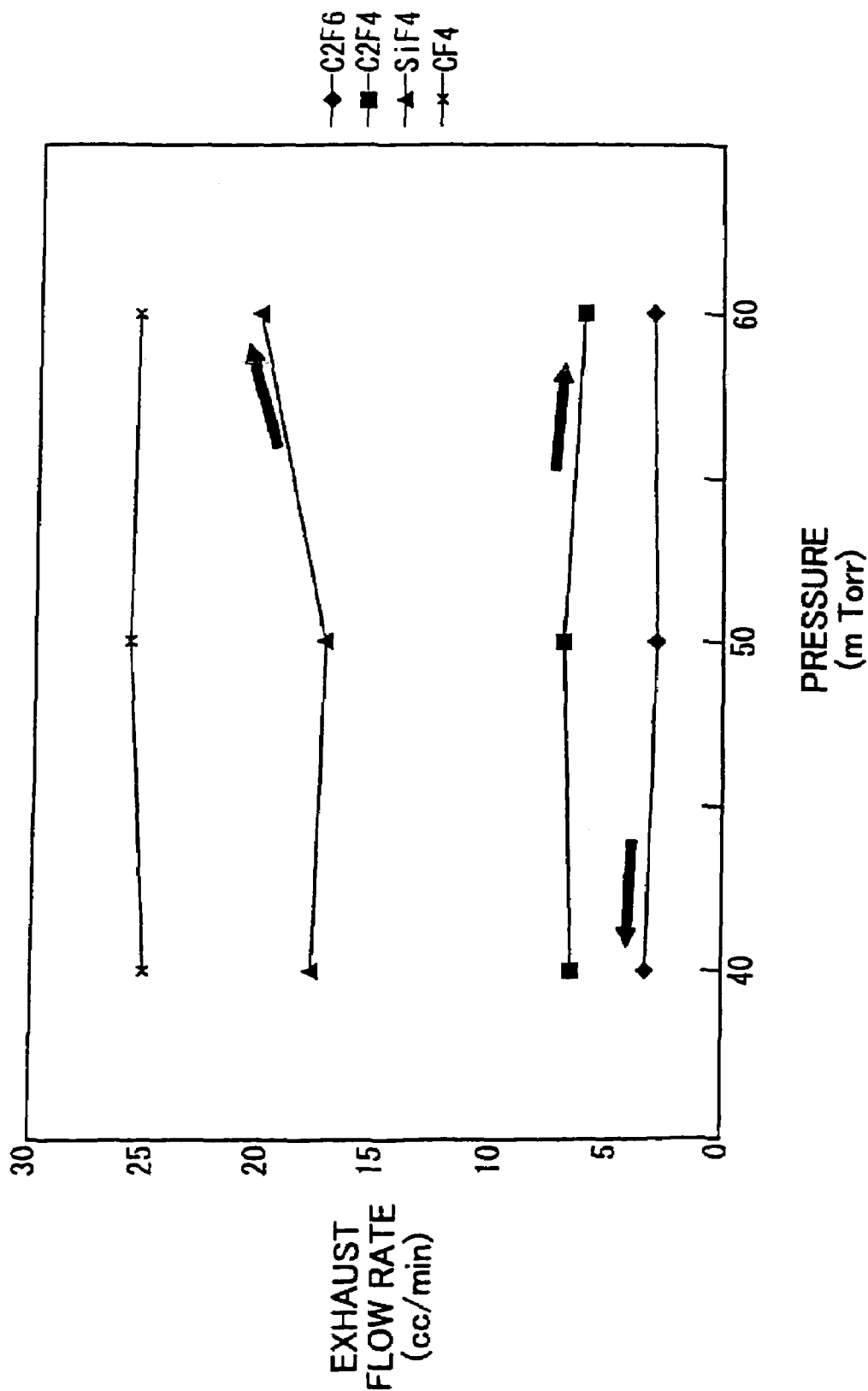
FIG. 16 is a graph showing the fluctuations of the flow rates of exhaust gas components when the pressure in a process chamber fluctuates.

FIG. 16 is a graph showing the fluctuations of the flow rates of the exhaust gas components when the pressure in a process chamber fluctuates. As the pressure in the process chamber decreases from a predetermined point, the flow rate of $C_2F_6$ increases, while the flow rates of $C_2F_4$, $SiF_4$, and $CF_4$ remain substantially unchanged. As the pressure in the process chamber increases from the predetermined point, the flow rate of $C_2F_4$ decreases, the flow rate of $SiF_4$ dramatically increases, and the flow rates of $C_2F_6$ and $CF_4$ remain substantially unchanged.

Figure 17:
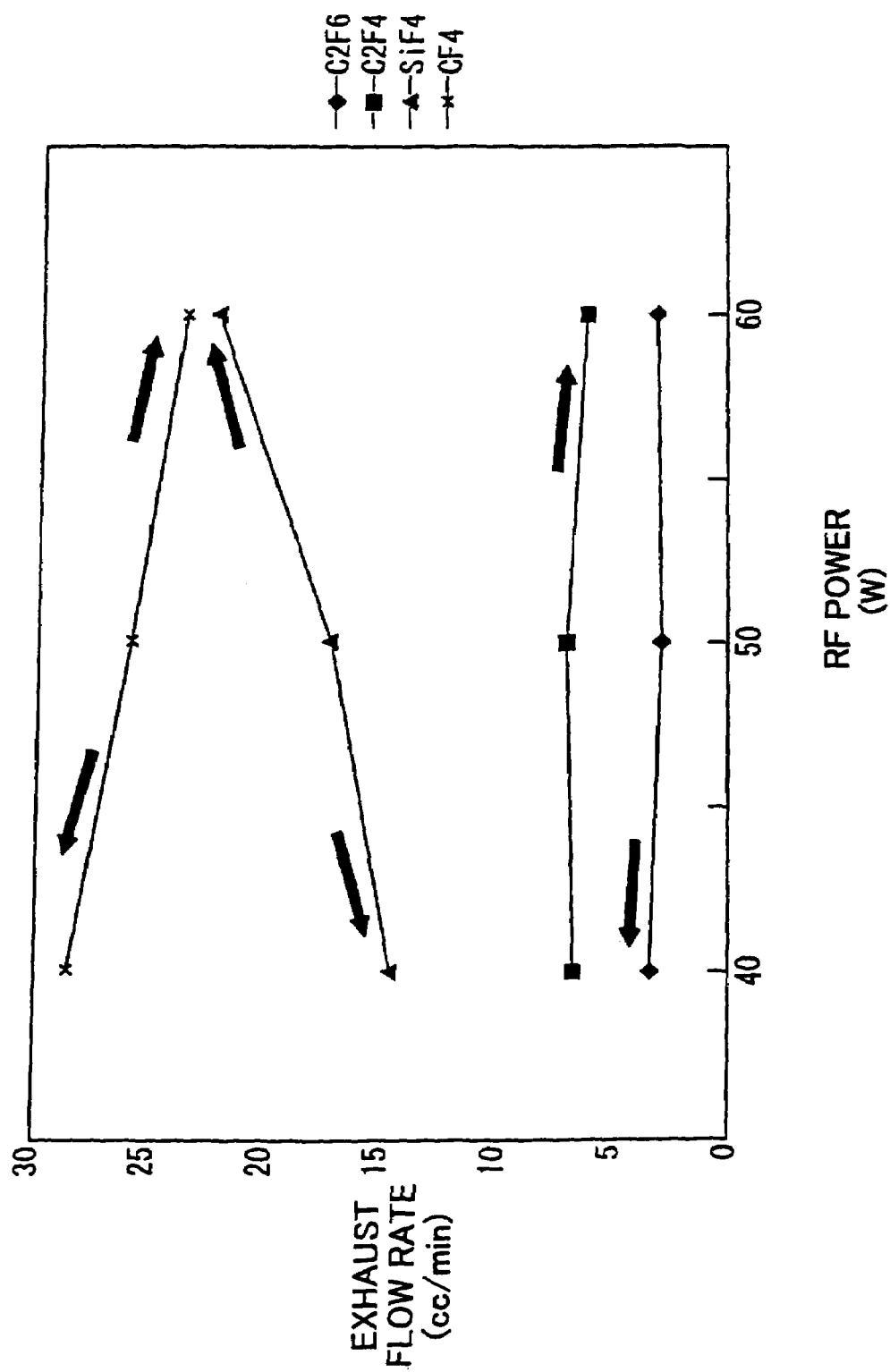
FIG. 17 is a graph showing the fluctuations of the flow rates of exhaust gas components when the RF power supplied to a process chamber fluctuates.

FIG. 17 is a graph showing the fluctuations of the flow rates of the exhaust gas components when the RF power supplied to the process chamber fluctuates. As the RF power in the process chamber decreases from a predetermined point, the flow rate of $C_2F_6$ increases, the flow rate of $C_2F_4$ remains substantially unchanged, the flow rate of $SiF_4$ dramatically decreases, and the flow rate of $CF_4$ dramatically increases. As the RF power supplied to the process chamber increases from the predetermined point, the flow rate of $C_2F_4$ decreases, the flow rate of $SiF_4$ dramatically increases, the flow rate of $CF_4$ dramatically decreases, and the flow rate of $C_2F_6$ remains substantially unchanged.

Figure 18:
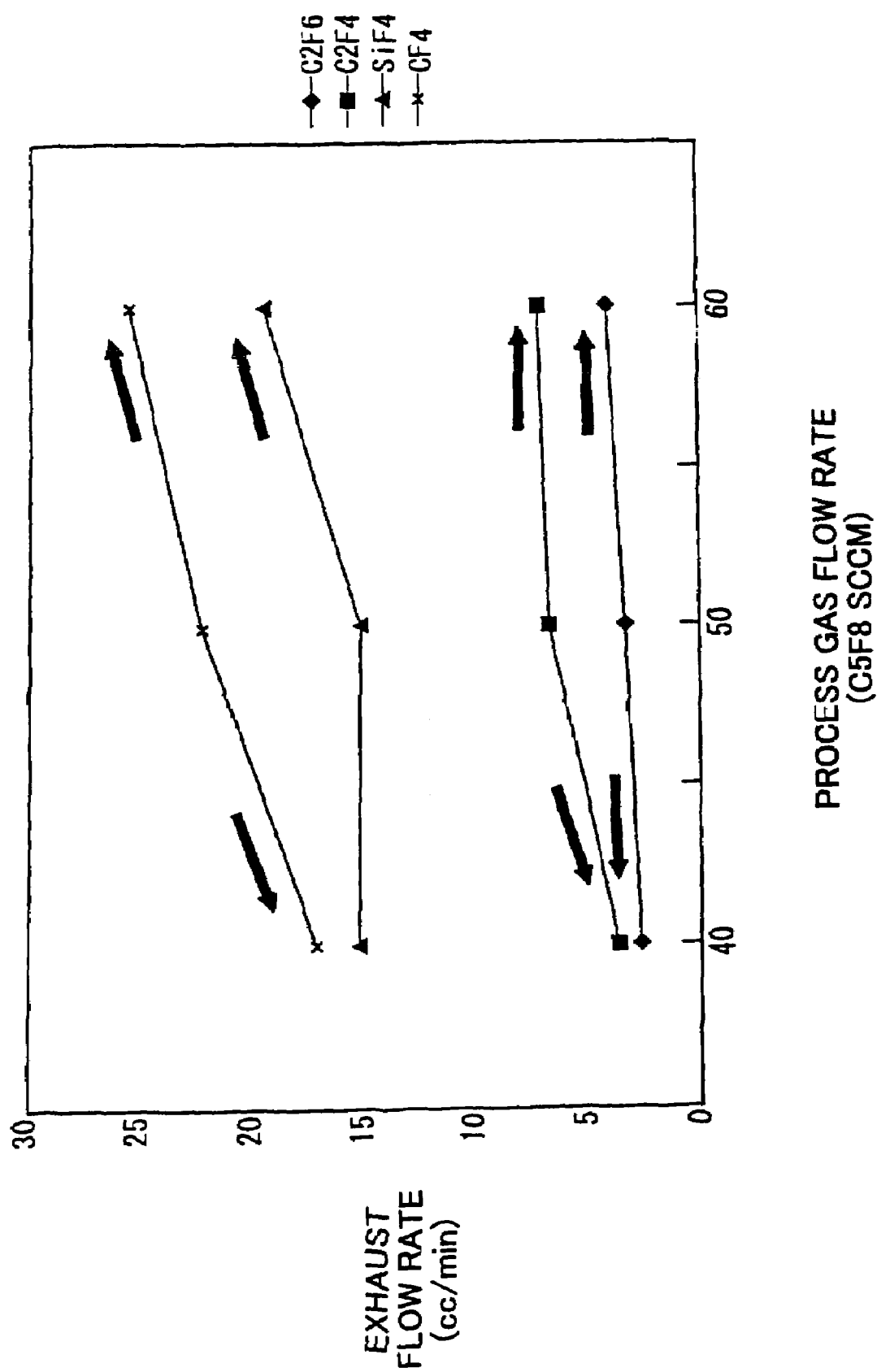
FIG. 18 is a graph showing the fluctuations of the flow rates of exhaust gas components when the flow rate of $C_5F_8$ among the process gases supplied to a process chamber fluctuates.

FIG. 18 is a graph showing the fluctuations of the flow rates of the exhaust gas components when the flow rate of $C_5F_8$ among the process gases supplied to the process chamber fluctuates. As the flow rate of $C_5F_8$ supplied to the process chamber decreases from a predetermined point, the flow rate of $C_2F_6$ decreases, the flow rate of $C_2F_4$ dramatically decreases, the flow rate of $SiF_4$ remains substantially unchanged, and the flow rate of $CF_4$ dramatically decreases. As the flow rate of $C_5F_8$ supplied to the process chamber increases from the predetermined point, the flow rates of $C_2F_6$ and $C_2F_4$ increase, and the flow rates of $SiF_4$ and $CF_4$ dramatically increase.

It is apparent from the above graphs that the fluctuation of the flow rate of each exhaust gas components has a specific tendency, with the inner pressure, the RF power, and the flow rate of the process gas ($C_5F_8$) being parameters.

FIGS. 19A through 19D are graphs showing the flow rate fluctuations of the exhaust gas components and the tolerable ranges thereof, with respect to the parameters.

FIG. 19A shows the flow rate fluctuation of $CF_4$ with the parameters. In FIG. 19A, the tolerable range is set based on a flow rate reference value (Base), as indicated by the slanting lines. When the inner pressure of the chamber decreases (indicated by "Low") or increases (indicated by "Hi"), the flow rate of $CF_4$ remains substantially unchanged and stays within the tolerable range. When the RF power decreases (Low), the flow rate of $CF_4$ increases to a point outside the tolerable range. When the RF power increases, the flow rate of $CF_4$ decreases, but remains in the tolerable range. If the flow rate of the gas ($C_5F_8$) decreases (Low), the flow rate of $CF_4$ dramatically decreases to a point outside the tolerable range. If the flow rate of the gas increases (Hi), the flow rate of $CF_4$ dramatically increases to a point outside the tolerable range. In FIG. 19A, the black squares indicate the $CF_4$ flow rates within the tolerable range, and the white squares indicate the $CF_4$ flow rates outside the tolerable range.

FIG. 19B is a graph showing the flow rate fluctuation of $SiF_4$ with respect to the parameters, which is plotted in the same manner as the graph of FIG. 19A. The flow rate of $SiF_4$ increases to a point outside the tolerable range, when the chamber inner pressure is "Hi". When the RF power is "Hi" or the gas flow rate is "Hi", the flow rate of $SiF_4$ also increases to a point outside the tolerable range. If the RF power is "Low", the flow rate of $SiF_4$ decreases to a point outside the tolerable range.

FIG. 19C is a graph showing the flow rate fluctuation of $C_2F_4$ with respect to the parameters, which is plotted in the same manner as the graph of FIG. 19A. The flow rate of $C_2F_4$ decreases to a point outside the tolerable range, when the chamber inner pressure is "Hi". When the RF power is "Hi" or the gas flow rate is "Low", the flow rate of $C_2F_4$ decreases to a point outside the tolerable range.

FIG. 19D is a graph showing the flow rate fluctuation of $C_2F_6$ with respect to the parameters, which is plotted in the same manner as the graph of FIG. 19A. The flow rate of $C_2F_6$ increases to a point outside the tolerable range, when the chamber inner pressure is "Low". When the RF power is "Low" or the gas flow rate is "Hi", the flow rate of $C_2F_6$ also increases to a point outside the tolerable range. When the RF power is "Hi" or the gas flow rate is "Low", the flow rate of $C_2F_6$ decreases to a point outside the tolerable range.

FIG. 20 shows the analysis results obtained from the graphs of FIGS. 19A through 19D. As shown in FIG. 20, when the chamber inner pressure is "Low", the flow rates of $CF_4$, $SiF_4$, and $C_2F_4$ are within the tolerable range, but the flow rate of $C_2F_6$ is outside the tolerable range. Here, a recognition signal is generated, with "0" representing a case where the flow rate is within the tolerable range, and "1" representing a case where the flow rate is outside the tolerable range. Accordingly, when the chamber inner pressure is "Low", the recognition signal is "0001".

When the chamber inner pressure is "Hi", the flow rates of $CF_4$ and $C_2F_6$ are within the tolerable range, but the flow rates of $SiF_4$ and $C_2F_4$ are outside the tolerable range. Here, a recognition signal is generated, with "0" representing a case where the flow rate is within the tolerable range, and "1" representing a case where the flow rate is outside the tolerable range. Accordingly, when the chamber inner pressure is "Hi" the recognition signal is "0110".

Likewise, when the RF power is "Low", the recognition signal is "1101". When the RF power is "Hi", the recognition signal is "0111". When the flow rate of the gas ($C_5F_8$) is "Low", the recognition signal is "1011". When the gas flow rate is "Hi", the recognition signal is "1111".

The recognition signal generated when a parameter is "Low" is different from the recognition signal generated when the same parameter is "Hi". More specifically, the recognition signal generated when the chamber inner pressure is "Hi" is different from the recognition signal generated when the chamber inner pressure is "Low" or when any other parameter is "Low" or "Hi". Accordingly, when the recognition signal "0001" is generated, there is a high possibility that the chamber inner pressure has decreased, and, therefore, whether the chamber inner pressure has decreased should be checked.

However, since the process conditions in the process chamber are complicatedly interrelated with one another, the recognition signal "0001" might be generated when the chamber inner pressure is not "Low". Therefore, it should be noted that the assumption made from the recognition signal "0001" only indicates a high possibility that the chamber inner pressure might need to be corrected, and does not necessarily indicate the item to be corrected.

In this embodiment, the correction item presumed from the recognition signal is displayed on the display screen of a semiconductor manufacturing device or the monitoring device 80, so as to notify the operation manager of the item that need to be corrected. If the recognition signal "0001" is generated by a process monitoring operation of the monitoring device 80 during an operation of the semiconductor manufacturing device, it is determined that an error has occurred in the process conditions for the semiconductor manufacturing device (or the process chamber), and that the process will leads to a defective wafer. Accordingly, the fact that an error exists in the process conditions is displayed on the display screen of the semiconductor manufacturing device or the monitoring device 80, so as to prompt the operation manager to perform a correction operation.

As well as the existence of an error, the item should be corrected is displayed in accordance with the recognition signal. If the recognition signal is "0001", there is a high possibility that the chamber inner pressure has decreased, and a message such as "check the chamber inner pressure for a decrease" is displayed on the display screen. When receiving the notification of the error in the process conditions, the operation manager of the semiconductor manufacturing device checks the chamber inner pressure in accordance with the message displayed on the display screen. If it is found that the chamber inner pressure has actually decreased, the operation manager adjusts the chamber inner pressure to return to a normal level.

When an error in the process conditions is notified, the display device immediately tells which item has a high probability of having an error. Thus, the cause of the error can be more effectively spotted in a short time, compared with a case where the items of the process conditions are checked one by one.

When the gas flow rate of $C_5F_8$ is too high, the recognition signal "1111" is generated, as shown in FIG. 20. In this case, there is a very low possibility that there is a cause other than the high flow rate of $C_5F_8$. Accordingly, when the recognition signal "1111" is generated, a signal is transmitted from the monitoring device 80 to the controller 4 of the semiconductor manufacturing device so as to reduce the flow rate of $C_5F_8$.

If it can be confirmed that the error in the process conditions is caused by one item, the item can be automatically controlled to-eliminate the error. Such an automatic control operation can be applied to any error in the process conditions (with any recognition signal), if the cause of each error in the process conditions is accurately spotted by accumulating and processing the analysis data on a statistical basis.

It should be noted that the above parameters (the chamber inner pressure, the RF power, the flow rate of $C_5F_8$) are merely an example, and other various items of process conditions can be employed as parameters. Also, the gas components ($CH_4$, $SiF_4$, $C_2F_4$, and $C_2F_6$) of the exhaust gas to be analyzed are merely an example, and any other gas components can be subjected to gas component analysis. Parameters and types of gas components to be analyzed should be suitably selected, so that the cause of each error in the process conditions can be accurately presumed.

The analysis result of exhaust gas components under various process conditions are accumulated, so that the cause of an error in the process conditions can be more accurately presumed. In this embodiment, the Fourier-transform infrared spectroscope (FT-IR) that can analyze gas components at a high speed is employed to monitor changes in the process conditions without delay. With such a Fourier-transform infrared spectroscope (FT-IR), the analysis results can be readily accumulated in a short period of time.

Next, the explanation moves on to a third embodiment of the present invention. In the third embodiment, analysis results from the monitoring device of the second embodiment are accumulated and used in various control operations.

More specifically, a Fourier-transform infrared spectroscope (FT-IR) is incorporated into each semiconductor manufacturing device that generates exhaust gas during an operation, such as a plasma etching device. In such a device, the component analysis data of the exhaust gas are accumulated, and the accumulated data are used for controlling the semiconductor manufacturing procedures or diagnosing a fault in the semiconductor manufacturing device.

In the second embodiment of the present invention described above, a monitoring device including a FT-IR is incorporated into one or a plurality of semiconductor manufacturing devices. The gas components of exhaust gas are analyses without delay, so as to facilitate the control operation for the semiconductor manufacturing procedures. In the second embodiment, reference data produced in accordance with analysis data obtained beforehand is stored in the monitoring device. The reference data is compared with newly obtained analysis data, and the cause of a change in the process conditions is presumed.

In the third embodiment of the present invention, however, a monitoring device including a FT-IR is incorporated into each semiconductor manufacturing device that generates exhaust gas during an operation. The analysis data obtained from the monitoring device are accumulated and controlled at one place. The accumulated data are then processed on a statistical basis to obtain practical data. The obtained results are then returned to each semiconductor manufacturing device.

The place in which the analysis data are accumulated is provided by the manufacturer, which manufactures and ships the semiconductor manufacturing devices. In this case, a monitoring device may be incorporated into each semiconductor manufacturing device at the shipment stage. The place for accumulating the analysis data may be an analysis center that is provided by the manufacturer of the semiconductor manufacturing devices, for instance. A semiconductor manufacturing device that has been shipped to the market and already in operation promptly sends analysis data to the analysis center via a data communication network.

Figure 21:
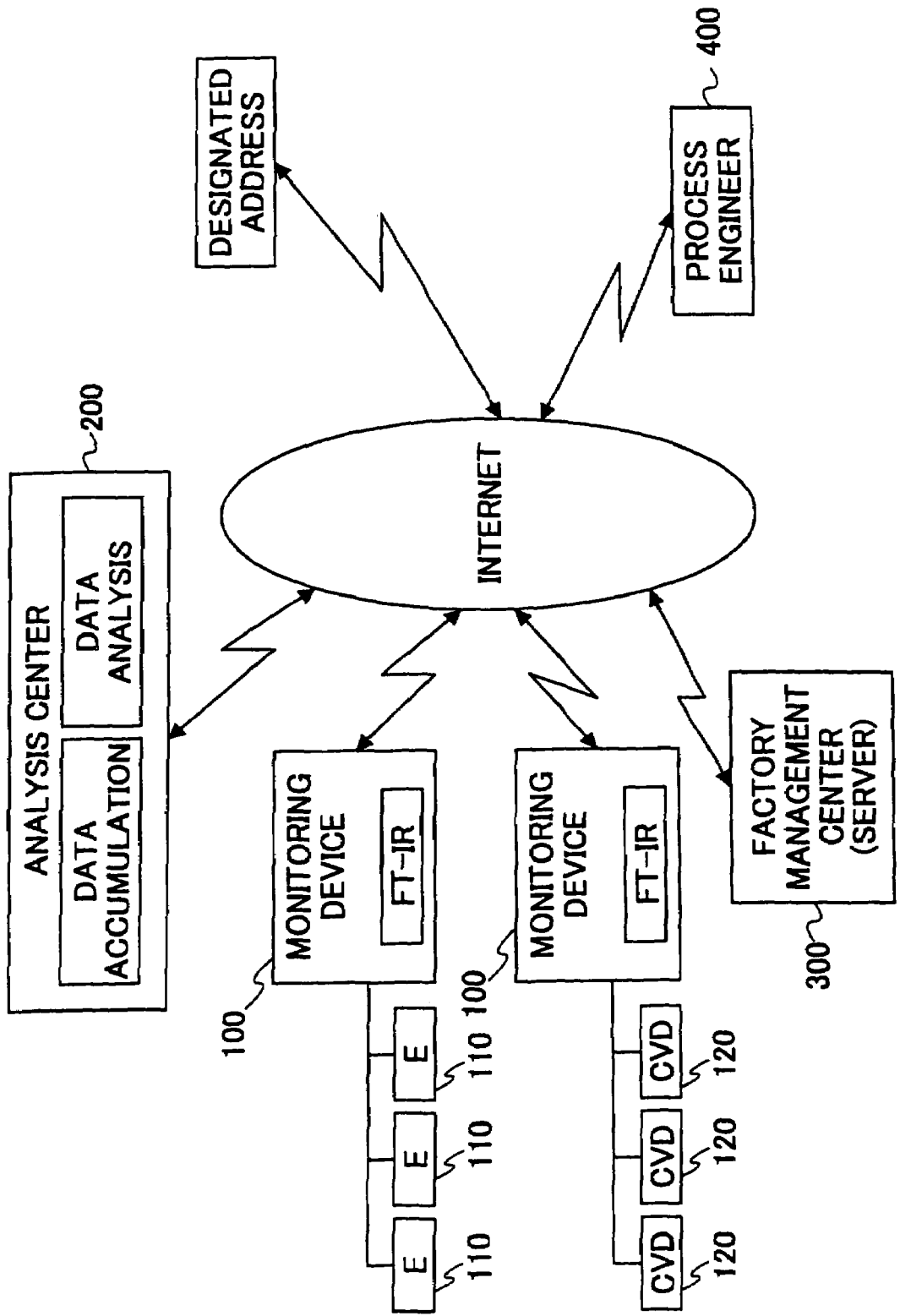
FIG. 21 shows the entire structure of a semiconductor manufacturing device control system in accordance with a third embodiment of the present invention.

FIG. 21 shows the entire structure of a semiconductor manufacturing device control system in accordance with this embodiment.

In FIG. 21, each etching device 110 in operation at a semiconductor device manufacturer is connected to a monitoring device 100 including a FT-IR, and the analysis data obtained from the FT-IR are sent to an analysis center 200 via the Internet. The analysis data may be sent instantly during the operation of each etching device 110, or may be sent at regular intervals. For the operation to promptly reflect each gas analysis result, it is desirable to send the analysis data instantly to the analysis center 200 during the etching operation. Although a plurality of etching devices 110 are connected to the single monitoring device 100 in FIG. 21, each one etching device 110 may be connected to one monitoring device 100.

Meanwhile, CVD devices 120 in operation at the semiconductor device manufacturer are also connected to a monitoring device 100 including a FT-IR, and the analysis data obtained from the FT-IR are sent to the analysis center 200 via the Internet. The analysis data may be sent instantly during the operation of each CVD device 120, or may be sent at regular intervals. For the operation to promptly reflect each gas analysis result, it is desirable to send the analysis data instantly to the analysis center 200 during the CVD operation. Although a plurality of CVD devices 120 are connected to the single monitoring device 100 in FIG. 21, each one CVD device 120 may be connected to one monitoring device 100.

The etching devices 110 and the CVD devices 120 are examples of semiconductor manufacturing devices that generate exhaust gas during an operation. However, as long as the exhaust gas analysis can be made by a FT-IR, examples of semiconductor manufacturing devices are not limited to the etching devices and the CVD devices.

When analysis data is sent from an etching device 110 or a CVD device 120 in operation, the analysis center 200 analyzes the analysis data. In the analysis center 200, analysis data sent from semiconductor manufacturing devices in operation at many semiconductor device manufactures are accumulated and managed under the categories of types or models of semiconductor manufacturing devices. In the analysis center 200, the accumulated analysis data are analyzed on a statistical basis, for instance, to produce practical information for operations and management of the semiconductor manufacturing devices. The analysis center 200 then sends the information obtained through the analysis to the transmitters of the analysis data via the Internet.

The reference values for analysis data comparison used in the monitoring device 80 of the second embodiment may be stored in the analysis center 200, so that the analysis center 200 can detect an error in the process conditions and then return the detection result to the monitoring device 80 via the Internet. Here, accessory information that will be described later is also transmitted to the monitoring device 80, so as to provide useful information for the operation managers of the semiconductor manufacturing devices.

For instance, the analysis center 200 analyzes analysis data from a large number of etching devices 110 of the same model, and recognizes which part of each etching device 110 often has a defect. The contents of the analysis data of the exhaust gas exhausted when the recognized part has a defect are stored in the analysis center 200. If the contents of analysis data newly received from one of the etching devices 110 are the same as the contents of the stored analysis data, the analysis center 200 returns the defective part information, which indicates the part having a defect, to the transmitter of the analysis data.

The monitoring device 100, which has received the defective part information, displays the part that is presumed to have a defect on the display screen. More specifically, the analysis center 200 calculates the mean time between failures (MTBF) of the semiconductor manufacturing devices of the same model, and returns the information concerning the part having a high possibility of failures to the transmitter of the analysis data.

FIG. 22 shows an example of the display screen of each monitoring device 100 that has received the defective part information.

In the example shown in FIG. 22, the recognition signal generated from analysis data in the same manner as in the second embodiment is "0001". In other words, the contents of the analysis data sent from the monitoring device 100 to the analysis center 200 indicate a high possibility that the process chamber pressure has decreased. After receiving the analysis data, the analysis center 200 transmits a recognition signal to the monitoring device 100. At the same time, the analysis center 200 provides the monitoring device 100 with the information that is obtained from the accumulated information and indicates the parts having a possibility of causing a decrease in the chamber inner pressure in the descending order.

In the above manner, the monitoring device 100 indicates that an error has occurred in the process conditions in the left side of the display screen, as shown in FIG. 22. Here, a message is also displayed to indicate a high possibility that the error has been caused by a decrease in the chamber inner pressure, and to prompt the operation manager to check the chamber inner pressure for a decrease. Meanwhile, in the right side of the display screen, the parts having a possibility of causing a decrease in the chamber inner pressure are shown in the descending order.

The operation manager, who has been notified of the error in the process conditions, looks at the left half of the display screen of the monitoring device 100, and recognizes that there is a high possibility of a decrease of the chamber inner pressure. The operation manager then looks at the right half of the display screen to instantly find out which items (parts) should be checked when the chamber inner pressure actually decreases. In this manner, from the information provided by the analysis center 200, the operation manager of the semiconductor manufacturing device can promptly obtain the information concerning the cause of the defect and countermeasures against the defect.

The returning of the defective part information as the accessory information is merely an example of a function of the analysis center 200 in this embodiment. More specifically, a database can be constructed based on the analysis data accumulated in the analysis center 200, and various types of accessory information can be transmitted to semiconductor manufacturing devices in operation. In this manner, useful information can be provided for the operation managers of the semiconductor manufacturing devices.

In FIG. 21, an office 400 at which a process engineer is constantly stationed, and a device having a communication function such as a computer installed in a factory managing center 300, are also connected to the analysis center 200 via the Internet. In this structure, the information for notifying an error in the process conditions can be transmitted to the process engineer and the factory managing center, as well as to the semiconductor manufacturing devices, via the Internet.

Furthermore, if a designated address is registered in advance, the information from the analysis center 200 and the analysis data from the monitoring device 100 can be automatically transmitted to the designated address. For instance, if the address of a process engineer is registered, the process engineer can check the operation state of each semiconductor manufacturing device and give a suitable instruction, even when he/she is on a business trip.

With the semiconductor manufacturing device control system of this embodiment, the analysis data of the exhaust gas exhausted during a test operation by a semiconductor manufacturing device for demonstration are compared with the analysis data of the exhaust gas exhausted during an actual operation by a semiconductor manufacturing device. Referring further to the information supplied from the database containing accumulated analysis data, a benchmark for approximating the actual analysis data to the demonstration analysis data can be obtained.

Alternatively, each semiconductor manufacturing device may be operated in a normal state at the time of shipment, so as to accumulate the analysis data of the exhaust gas. The accumulated analysis data are compared with the analysis data obtained when the semiconductor manufacturing device is first operation since the arrival at the customer. By doing so, the information for solving a problem due to the difference in the environmental conditions between the client and the manufacturer can be obtained.

There is a characteristic difference between each two semiconductor manufacturing devices (each device having intrinsic characteristics). Because of this, the process results might be different from one another, even if the semiconductor manufacturing devices are operated under the same conditions. In this embodiment, the analysis data obtained from a large number of devices are accumulated and stored in a database, so that the differences between the process results due to the characteristic differences can be easily reduced.

Also, there is a possibility that a toxic gas or an explosive gas is generated as a reactive product of the process gas. The information concerning such a reactive product is accumulated in the database of the analysis center 200, so that the operation manager of the device can be promptly notified which countermeasures should be taken against the harmful reactive product.

If a toxic gas is generated as a reactive product during an operation of a semiconductor manufacturing device, the toxic gas is detected from the analysis data, and the operation manager of the semiconductor manufacturing device is promptly notified of the generation of the toxic gas. At the same time, accessory information, such as which measures should be taken when a person inhales the toxic gas, can be sent to the operation manager. Alternatively, automatic access to a homepage showing accessory information of various types may be allowed, or the address of such a homepage may be displayed. It is also possible for the display screen to display the device in which the toxic gas has been generated, so as to show the escape guide to the people in the vicinity of the device.

Also, the combinations of gases that might react and generate an explosive gas or a toxic gas at an exhaust duct provided at the exhaust end of the process chamber may be registered in the database, so as to notify the operation manager of the harmful combination of gases prior to the generation of a harmful reactive product. In this manner, accidents can be prevented in advance.

Although the analysis center 200 and the semiconductor manufacturing devices (the monitoring devices 100) are connected via the Internet in the above described embodiment, the communication means is not limited to the Internet, but other various data communication means, such as a public telephone line network, E-mail communication, or Internet packet communication, can be used.

Figure 23:
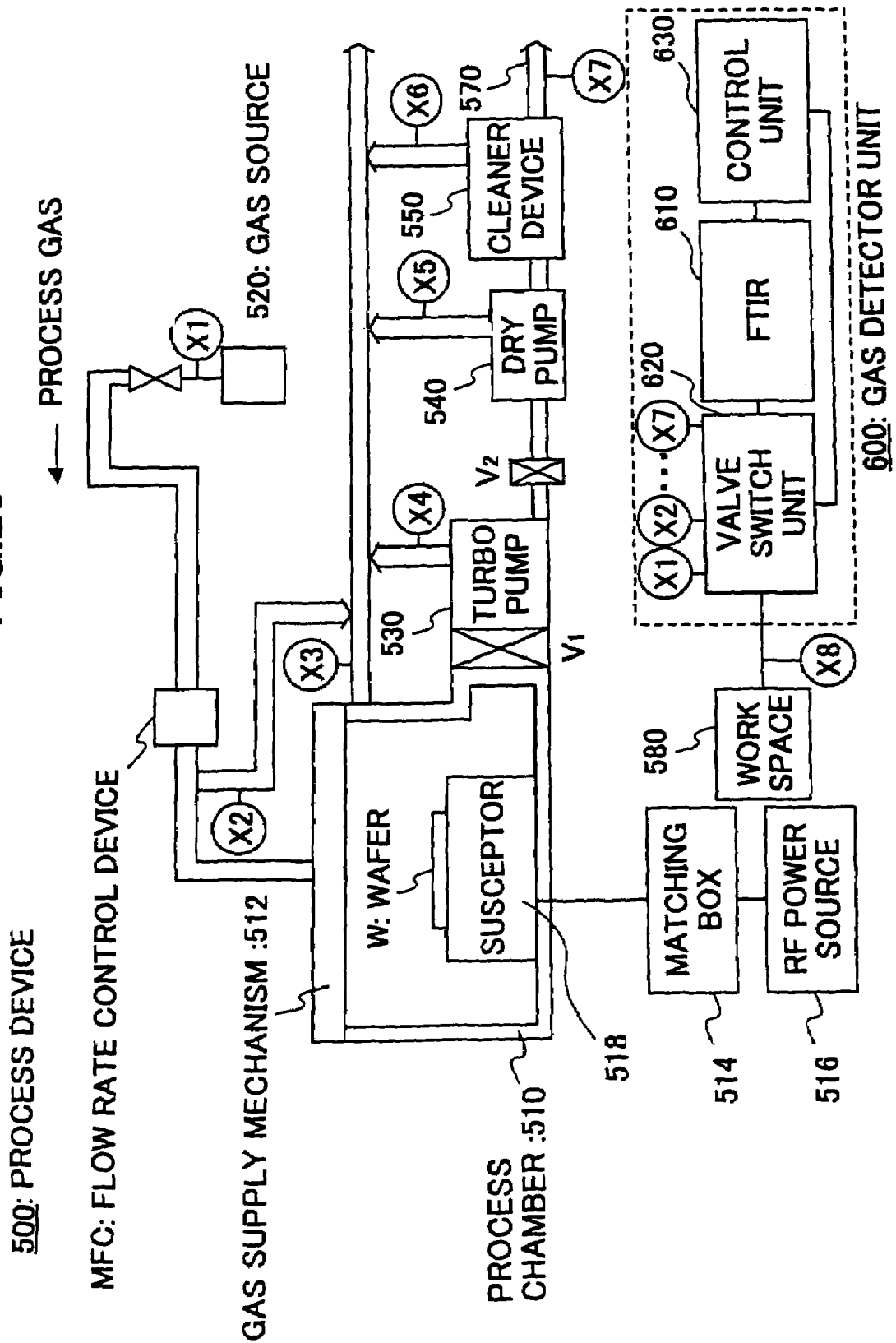
FIG. 23 shows the entire structure of a process device in accordance with a fourth embodiment of the present invention.

Referring now to FIG. 23, a fourth embodiment of the present invention will be described.

FIG. 23 shows the structure of a process device 500 in accordance with the fourth embodiment of the present invention. The process device 500 introduces process gas into an airtight process chamber to perform a predetermined operation on a semiconductor wafer that is a process object to be processed in the airtight process chamber. In FIG. 23, the schematic view of the inner structure of a process chamber 510 is shown.

As shown in FIG. 23, the process chamber 510 of the process device 500 includes a gas supply mechanism 512 for supplying process gas to the process chamber 510 via a flow rate control device MFC, and a susceptor 518 to which a radio-frequency power source 516 is connected via a matching box 514. On the susceptor 518, a wafer W is placed. The process device 500 includes a gas source 520 for supplying process gas to the process chamber 510, a turbo pump 530 that is attached to the exhaust side of the process chamber 510 via a valve V1 and exhausts the process gas from the process chamber 510, a dry pump 540 that is placed on the downstream side of the turbo pump 530 via a valve V2 and reduces the pressure by further exhausting the downstream side of the turbo pump 530, and a cleaner device 550 that is placed on the downstream side of the dry pump 540 and performs predetermined operations, such as absorption and decomposition, on the gas components that should not be released to the external air.

The process device 500 further includes a gas detector unit 600. The gas detector unit 600 detects the gas concentration at a plurality of detection points in the process device 500. In the following, these detection points and the gas detection unit 600 will be described in detail.

To check for a gas leak or perform a maintenance operation, a plurality of detection points are set at locations where the gas concentration needs to be detected in the process device 500. In the example shown in FIG. 23, the detection points includes a detection point X1 on the downstream side of the gas source 520, a detection point X2 on the downstream side of the flow rate control device MFC, a detection point X3 on the process chamber 510, a detection point X4 on the downstream side of the turbo pump 530, a detection point X5 on the downstream side of the dry pump 540, a detection point X6 at the cleaner device 550 on the side of a first exhaust system 560, a detection point X7 at the cleaner device 550 on the side of a second exhaust system 570, and a detection point X8 at a work space 590 where the processes of the process device 500 are carried out. It should be noted that the arrangement of the detection points is not limited to the example shown in FIG. 23, but may be modified if necessary.

The gas detector unit 600 connects a Fourier-transform infrared spectroscope (FT-IR) 610 and the plurality of detection points X1 through X8 in parallel, and includes a valve switch unit 620 for switching the detection points connected to the FT-IR 610 at a predetermined timing, and a control unit 630 to which the information of each corresponding detection point is sent from the FT-IR 610 so as to perform predetermined control operations.

As described above, the FT-IR 610 is capable of detecting a gas concentration at a resolution of 1 ppm or lower, which is sufficient as a gas detecting means. Also, by detecting the concentration of each gas, the absolute value of each gas can be obtained with a precision of 0.1 cm$^3$ (0.1×10$^{-6}$ m$^3$) or lower.

The FT-IR 610 samples a part of the gas at each of the detection points X1 through X8 to detect the gas concentration. Of the gas sampled by the FT-IR 610, the gas components that can be released to the external air are released through the first exhaust system 560, and the gas components that cannot be released to the external air are released through the second exhaust system 570 via the cleaner device 550.

The control unit 630 not only controls the FT-IR 610 and the valve switch unit 620 in the gas detector unit 600, but also performs predetermined operations after receiving the information of each of the detection points X1 through X8 from the FT-IR 610. For instance, if a gas leak is detected at one of the detection points, the control unit 630 performs an operation, such as gathering the gas amount observation data, controlling each component of the process device 500, or giving an alarm to the operator.

With the process device 500 including the gas detector unit 600 for detecting the concentration of process gas at the plurality of detection points X1 through X8 and the FT-IR 610 in the gas detector unit 600, the gas concentration can be detected with a high precision. Accordingly, even if a gas leak is caused, suitable measures can be taken promptly.

Also, since the plurality of detection points X1 through X8 are connected in parallel and are switched by the valve switch unit 620, the gas concentration at each of the detection points X1 through X8 can be detected by the single FT-IR 610. Thus, the gas concentration detecting operation can be performed with a high precision, while an increase in the costs is prevented.

Furthermore, since the detection point X8 is set in the work space of the process device, a harmful toxic gas existing in the work space can be immediately detected and removed, so as to protect the operator from inhaling the toxic gas.

As described above, the gas detector unit 600 functions as a gas leak detecting means, detecting the gas flow rate at each of the detection points X1 through X8. The gas detector unit 600 also functions as a device diagnosing means for the components of the process device 500 during an operation or maintenance or when a fault is caused. In the following, a diagnosing operation for the flow rate control device MFC will be described as an example of a device diagnosing operation performed by the gas detector unit 600.

First, a predetermined amount of process gas is supplied from the gas source 520 to the flow rate control device MFC. The flow rate control device MFC then controls the flow rate of the process gas to be supplied to the process chamber 510. With the valve switching by the valve switch unit 620, the FT-IR 610 detects the gas flow rate at the detection point X2 on the downstream side of the flow rate control device MFC, i.e., the flow rate of the process gas supplied to the process chamber, under the control of the flow rate control device MFC.

The information of the detection point X2 is transmitted from the FT-IR 610 to the control unit 630. The control unit 630 then compares the flow rate of the process gas actually supplied to the process chamber 510 with the flow rate of the process gas to be supplied to the process chamber 510 when the flow rate control device MFC is functioning properly, so as to obtain the difference between the flow rates. The flow rate difference can be calculated for the process or each wafer W, or for every predetermined number of wafers W, or at regular intervals. If the flow rate difference is outside a predetermined tolerable range, it is determined that an error has occurred in the flow rate control device MFC, and a suitable operation is performed. In this case, the control unit 630 performs operations including: 1) controlling the flow rate control device MFC to adjust the supply amount of the process gas; 2) notifying the operator or the manager of the error in the flow rate control device MFC by giving an alarm through a siren or the like; and 3) stopping the operation of the process device 500.

Since the detection point X2 is set on the downstream side of the flow rate control device MFC, the control operation performed on the process gas by the flow rate control device MFC can be detected without delay, as described above. Accordingly, even if an unexpected error or fault is caused in the flow rate control device in operation, the suitable measures can be immediately taken. Also, since the gas detection unit 600 can be used during a maintenance operation, it is not necessary to employ a pressure sensor as in the above-described buildup.

It should be noted that the inner structure of the process chamber and the arrangement of the valves are not limited to the structure described above, and may be modified if necessary. Also, the locations of the detection points may be changed with a modification in the structure of the process device.

Although the device diagnosing operation for the flow rate control device is taken as an example of an operation by the gas detection unit in the above description of this embodiment, the gas detection unit is not limited to this example, and may function as a device diagnosing means for other components of the process device. For instance, the gas detection unit equipped with the FT-IR can perform operations, such as checking a change in the pressure atmosphere in the process chamber or checking the components of exhaust gas, with a high precision. In this manner, the gas detection unit equipped with the FT-IR can be widely used as a process analysis tool in accordance with the present invention.

As described above, this embodiment provides a process device that introduces process gas into an airtight process chamber and performs a predetermined operation on a process object placed in the process chamber. This process device includes a gas detection unit, and this gas detection unit includes: a Fourier-transform infrared spectroscope; a switch unit that connects a plurality of detection points in parallel, and switches the detection points connected to the Fourier-transform infrared spectroscope at a predetermined timing; and a control unit that receives the information of the detection points from the Fourier-transform infrared spectroscope and then performs a suitable control operation.

With the process device in accordance with this embodiment, gas concentration detection can be carried out with a high precision, while an increase in the costs is prevented. Accordingly, if there is a gas leak, suitable measures can be immediately taken to prevent a large gas leak, and the operation can be effectively protected from accidents.

Even if there is an unexpected error or fault in the flow rate control device during an operation, suitable measures can be immediately taken. Furthermore, this embodiment does not require any other device such as a pressure sensor for a maintenance operation.

As described so far, in the present invention, the components of process exhaust gas are analyzed to presume that there is an error in the process conditions, and if it is determined that there is an error, a signal indicating a process error is outputted. In accordance with this signal, a notification of the error occurrence is sent to the operation manager of the device, prompting the operation manager to adjust the process conditions. The process exhaust gas is a product from an actual process carried out for the process object, and therefore reflects the actual process. Accordingly, compared with a case where each item of the process conditions prior to the process of the process object is adjusted to a target value so as to control the reaction with the process object, a more precise control operation for the process conditions can be performed by adjusting the process conditions based on the components of the process exhaust gas reflecting the actual reaction with the process object.

Also, with the Fourier-transform infrared spectroscope employed as an analysis means having a very high analysis speed, analysis results can be obtained without delay, and the process for the object to be processed can promptly reflect the analysis results. For instance, if an error is caused in the process conditions during a process carried out for process objects in a single lot, the process can be immediately stopped, and the process conditions can be adjusted to the normal state. In this manner, a continuous process on a number of process objects under the unsuitable process conditions can be prevented before too late.

Furthermore, in the present invention, the analysis data obtained from the analysis of exhaust gas components by the Fourier-transform infrared spectroscope are registered in the database of a data accumulation control unit via a data communication network. More specifically, the analysis data from various semiconductor manufacturing devices in actual operation at a device manufacturer are immediately registered in the database. The analysis data are then analyzed based on the database, so that an error detecting operation for the process conditions can be performed with a high precision. The detection result is immediately sent to each corresponding semiconductor manufacturing device via the data communication network. In this manner, the operation manager of each semiconductor manufacturing device can be promptly notified of an error.

With the accessory information, the operation manager of each semiconductor manufacturing device can also be provided with information concerning the error, and suitable measures can be immediately taken against the error or any danger accompanying the error.

In accordance with the present invention, semiconductor manufacturing devices in operation at a factory of a semiconductor device manufacturer can be managed at an analysis center. In the analysis center, a database is constructed by gathering and accumulating analysis data supplied from the semiconductor manufacturing devices in operation at the semiconductor device manufacturer. Using this database, a high-precision managing operation can be performed for the semiconductor manufacturing devices.

The invention claimed is:

1. A method of controlling a semiconductor manufacturing device that exhausts process exhaust gas during operation, comprising the steps of:
   sampling process gas at an exit of an exhaust vacuum pump that evacuates the process exhaust gas from a chamber of said semiconductor manufacturing device; and
   sending analysis data obtained from an analysis made on components of the process exhaust gas from the chamber of the semiconductor manufacturing device, the analysis data being sent to a data communication network.

2. The method as claimed in claim 1, wherein the analysis is made by a Fourier-transform infrared spectroscope.

3. The method as claimed in claim 1, wherein:
   a signal indicating an error is provided with accessory information related to the error and then transmitted to the data communication network,
   the error in process conditions and the cause of the error are reported to an operation manager in accordance with the signal indicating the error, and
   information related to the error is also reported to the operation manager in accordance with the accessory information.

4. A method of controlling at least one of a plurality of semiconductor manufacturing devices that exhausts process exhaust gas during operation, comprising:
   sampling process gas at an exit of an exhaust vacuum pump that evacuates the process exhaust gas from a chamber of said at least one of a plurality of semiconductor manufacturing devices;
   sending analysis data obtained from an analysis made on components of the exhaust process gas from the chamber of said semiconductor manufacturing device, the analysis data being sent to an analysis center;
   constructing a database by accumulating the analysis data from the plurality of semiconductor manufacturing devices; and
   controlling the at least one of the plurality of semiconductor manufacturing devices in accordance with the database.

5. The method as claimed in claim 4, wherein the analysis is made by a Fourier-transform infrared spectroscope.

6. A method of controlling a semiconductor manufacturing device by monitoring process exhaust gas containing a plurality of gas components generated from a process carried out in a process chamber for a process object under predetermined process conditions, comprising:
   sampling the process exhaust gas at an exit of an exhaust vacuum pump that evacuates the process exhaust gas from the process chamber;
   analyzing the components of the process exhaust gas to produce analysis data;
   sending the analysis data to a data communication network;
   comparing the analysis data with reference analysis data of an analysis of process exhaust gas generated as a result of a process carried out under reference process conditions;
   generating and outputting a signal indicating a process status based on at least one of a reference analysis result or the comparison between the analysis data and the reference analysis data; and
   sending the signal indicating the process status to said semiconductor manufacturing device.

7. The method as claimed in claim 6, wherein analyzing the components of the process exhaust gas is carried out by a Fourier-transform infrared spectroscope.

8. The method as claimed in claim 6, further comprising:
   providing an alarm in accordance with the signal indicating the process status.

9. The method as claimed in claim 6, further comprising:
   adjusting process conditions in accordance with the signal indicating the process status.

10. The method as claimed in claim 6, wherein comparing includes storing the analysis data in a memory so as to compare a plurality of sets of analysis data with the reference analysis data.

11. The method as claimed in claim 6, wherein comparing includes storing a plurality of sets of analysis data in association with each set of reference analysis data.

12. The method as claimed in claim 6, further comprising:
   switching process exhaust gas passages for sampling the process exhaust gas at a plurality of locations.

13. The method as claimed in claim 12, further comprising:
   controlling the analyzing and the switching.

14. The method as claimed in claim 13, further comprising:
   storing comparison data in a comparison result memory so that a comparison operation for each process is performed by supplying a signal during controlling and the comparison data is stored in the comparison result memory.

15. The method as claimed in claim 7, further comprising:
   introducing nitrogen gas used in a zero calibration operation of the Fourier-transform infrared spectroscope to a gas introduction unit of the Fourier-transform infrared spectroscope; and
   controlling introducing nitrogen gas so that a zero calibration is performed at predetermined regular intervals.

16. The method as claimed in claim 6, further comprising a step of adjusting a flow rate of the process exhaust gas.

17. The method as claimed in claim 16, further comprising:

giving an alarm when the flow rate of the process exhaust gas is outside a predetermined range.

18. The method as claimed in claim 6, further comprising:
supplying a constant flow of inert gas to a vacuum pump for exhausting the process exhaust gas.

19. The method as claimed in claim 6, wherein comparing includes determining from the comparison result whether or not an amount of at least one gas component of the process exhaust gas has fallen outside of a predetermined range set around a reference value obtained from the reference analysis result, and the process status represents a process error.

* * * * *